United States Patent
Iwasa

(10) Patent No.: US 6,313,509 B1
(45) Date of Patent: *Nov. 6, 2001

(54) SEMICONDUCTOR DEVICE AND A MOS TRANSISTOR FOR CIRCUIT PROTECTION

(75) Inventor: Shoichi Iwasa, Tokyo (JP)

(73) Assignee: Nippon Steel Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,367

(22) Filed: Mar. 31, 1998

(30) Foreign Application Priority Data

Apr. 4, 1997 (JP) ................................... 9-102742

(51) Int. Cl.[7] .................................................. H01L 23/62
(52) U.S. Cl. ........................ 257/357; 257/173; 257/355; 257/360; 257/546; 361/18; 361/19; 361/91.1; 361/91.5
(58) Field of Search ................................. 257/327, 336, 257/338, 344, 351, 173, 355, 356, 360, 546, 357; 361/18, 19, 56, 91.1, 91.5

(56) References Cited

U.S. PATENT DOCUMENTS

| | | | |
|---|---|---|---|
| 5,281,841 | * | 1/1994 | Van Roozendaal et al. ......... 257/360 |
| 5,472,887 | * | 12/1995 | Hutter et al. .......................... 438/231 |
| 5,663,103 | * | 9/1997 | Iwasa et al. .......................... 438/301 |
| 5,744,372 | * | 4/1998 | Bulucea ................................. 438/231 |
| 5,780,912 | * | 7/1998 | Burr et al. ............................ 257/408 |
| 6,078,082 | * | 6/2000 | Bulucea ................................. 257/345 |
| 6,177,298 | * | 1/2001 | Quigley ................................. 438/135 |

FOREIGN PATENT DOCUMENTS

| | | | |
|---|---|---|---|
| WO-90/07794 | * | 7/1990 | (DE) . |
| 63-275179 | * | 11/1988 | (JP) . |
| 6-53497 | | 2/1994 | (JP) . |
| 6-61438 | | 3/1994 | (JP) . |
| 6-260638 | | 9/1994 | (JP) . |
| 7-106567 | * | 4/1995 | (JP) . |
| 7-321320 | | 12/1995 | (JP) . |

* cited by examiner

Primary Examiner—Olik Chaudhuri
Assistant Examiner—Alonzo Chambliss
(74) Attorney, Agent, or Firm—Connolly Bove Lodge & Hutz

(57) ABSTRACT

A semiconductor device including an input protective circuit. A first transistor has a gate formed on the semiconductor substrate and a first and second conductive region is formed on each side of the first gate. Third and fourth conductive regions are respectively formed between the first and second conductive regions and the gate. The third conductive region has a resistance higher than that of the first conductive region, and the fourth conductive region has a conductivity type opposite to the conductivity type of the remaining regions. A second transistor is formed with a pair of conductive regions at an insulated gate. One of the pair of conductive regions is of the second transistor connected to the first transistor, first or second conductive region.

23 Claims, 23 Drawing Sheets

SEMICONDUCTOR DEVICE AND A MOS TRANSISTOR FOR CIRCUIT PROTECTION

BACKGROUND OF THE INVENTION

1. Field of the Invention

The present invention relates to a semiconductor device having an input protective circuit and a method of manufacturing the same and, more particularly, to a semiconductor device with a CMOS structure having a pMOS transistor and nMOS transistor and a method of manufacturing the same.

2. Description of the Related Art

In some cases, an excess surge voltage beyond the withstand strength of an internal circuit is applied to the input/output terminal of a semiconductor integrated circuit or the like due to, e.g., static electricity. If this excess surge voltage is directly applied to the internal circuit, the internal circuit is destructed. To cope with this phenomenon, an input protective circuit is inserted between the input/output terminal and the internal circuit to prevent an excess surge voltage applied to the input/output terminal from being applied to the internal circuit.

Recently, high integration densities and high-level functions of semiconductor devices are attained, and demand for a high-performance input protective circuit has arisen accordingly. An attempt has been made to increase the withstand strength of the input protective circuit to improve the driving power.

For example, Japanese Patent Laid-Open No. 7-321320 discloses an offset type MOS transistor having a high withstand strength. This MOS transistor is formed on a p-type semiconductor substrate and has a normal n-type heavily doped diffusion layer on the drain side, and an LDD structure only on the source side.

Japanese Patent Laid-Open No. 6-53497 discloses a CMOS transistor having a low breakdown voltage and a high withstand strength. In this CMOS transistor, the source and drain are respectively formed from a heavily doped diffusion layer, and another heavily doped diffusion layer adjacent to the heavily doped diffusion layer and having an opposite conductivity type.

Japanese Patent Laid-Open No. 6-260638 discloses a COOS transistor having impurity diffusion layers with a low junction withstand strength. In this CMOS transistor, at least one of the source and drain is partially formed from a heavily doped diffusion layer and a lightly doped diffusion layer adjacent to the heavily doped diffusion layer and having the same conductivity type, and the remaining portion is formed from a heavily doped diffusion layer and a lightly doped diffusion layer adjacent to the heavily doped diffusion layer and having an opposite conductivity type.

Japanese Patent Laid-Open No. 6-61438 discloses a CMOS transistor having a high withstand strength. The drain has an LDD structure including a lightly doped diffusion layer and a heavily doped diffusion layer, and additionally, a lightly doped diffusion layer of an opposite conductivity type is formed on the channel side of the lightly doped diffusion layer.

As a method of effectively forming an nMOS transistor and a pMOS transistor in a CMOS transistor, a so-called split gate method has been proposed.

In the split gate method, the gate electrodes of an nMOS transistor and a pMOS transistor are separately formed. A resist mask to be used for patterning is also used for ion implantation in forming a lightly doped n- or p-type diffusion layer as a constituent element of an LDD structure, thereby reducing the labor. This method has received a great deal of attention as a CMOS transistor manufacturing method advantageous in cost.

When a CMOS transistor is to be formed by the split gate method, the CMOS transistor and an input protective circuit may be simultaneously formed. However, with the conventional split gate method, only one n- or p-channel transistor can be formed once. This also applies to the techniques disclosed in the above prior arts, so the conventional split gate method cannot be applied to these prior arts.

SUMMARY OF THE INVENTION

It is an object of the present invention to provide a semiconductor device having an input protective circuit which is formed simultaneously with a CMOS transistor and has a high withstand strength and high-level functions, and a method of manufacturing the same.

According to an aspect of the present invention, there is provided a semiconductor device having at least first and second transistors formed on a semiconductor substrate, the first transistor having a first gate formed on the semiconductor substrate via a first insulating film, a first conductive region formed in a surface region of the semiconductor substrate on one side of the first gate, a second conductive region formed in the surface region of the semiconductor substrate on the other side of the first gate, a third conductive region formed in the surface region of the semiconductor substrate between the first conductive region and a lower portion on one side of the first gate of the first transistor, and a fourth conductive region formed in the surface region of the semiconductor substrate between the second conductive region and a lower portion on the other side of the first gate of the first transistor, the first, second, and third conductive regions having the same conductivity type while the fourth conductive region having a conductivity type opposite to that of the third conductive region, and the third conductive region having a resistance higher than that of the first conductive region; and the second transistor having a second gate formed on the semiconductor substrate via a second insulating film and a pair of conductive regions, and one of the pair of conductive regions being connected to at least one of the first and second conductive regions.

According to another aspect of the present invention, there is provided a semiconductor device comprising a first semiconductor region, a first conductive film patterned on the first semiconductor region via a first insulating film, and a pair of first diffusion layers formed by doping an impurity in a surface region of the first semiconductor region on both sides of the first conductive film, one of the first diffusion layers being formed at least near the first conductive film and having at least a first lightly doped portion having the same conductivity type as that of the first semiconductor region and a first heavily doped portion having a conductivity type opposite to that of the first semiconductor region and connected to the first lightly doped portion, and the other of the first diffusion layers being formed at least near the first conductive film and having a second lightly doped portion having a conductivity type opposite to that of the first semiconductor region and a second heavily doped portion having a conductivity type opposite to that of the first semiconductor region and connected to the second lightly doped portion.

According to still another aspect of the present invention, there is provided a semiconductor device having a transistor, the transistor having: a gate formed on a semiconductor substrate via an insulating film; a first conductive region formed in a surface region of the semiconductor substrate on one side of the gate; a second conductive region formed on the surface region of the semiconductor substrate on the other side of the gate; a third conductive region formed at least in the surface region of the semiconductor substrate between the first conductive region and a lower portion on one side of the gate of the transistor; and a fourth conductive region formed at least in the surface region of the semiconductor substrate between the second conductive region and a lower portion on the other side of the gate of the transistor, the first, second, and third conductive regions having the same conductivity type while the fourth conductive region having a conductivity type opposite to that of the third conductive region, the third conductive region having a resistance higher than that of the first conductive region, the third conductive region being formed to cover a region from a side surface to a lower surface of the first conductive region, and the fourth conductive region being formed to cover a region from a side surface to a lower surface of the second conductive region.

According to still another aspect of the present invention, there is provided a semiconductor device having a transistor, the transistor having: a gate formed on a semiconductor substrate via an insulating film; a first conductive region formed in a surface region of the semiconductor substrate on one side of the gate; a second conductive region formed in the surface region of the semiconductor substrate on the other side of the gate, the gate having a projecting portion on the second conductive region side in a direction of gate width; a third conductive region formed at least in the surface region of the semiconductor substrate between the first conductive region and a lower portion on one side of the gate of the transistor, the third conductive region having a resistance higher than that of the first conductive region; a fourth conductive region formed in the surface region of the semiconductor substrate at a lower portion of a distal end region of the projecting portion of the gate, the fourth conductive region having a resistance higher than that of the second conductive region, and the first, second, third, and fourth conductive regions having the same conductivity type; and a fifth conductive region formed in the surface region of the semiconductor substrate at an edge portion of the projecting portion of the gate, the fifth conductive region having a conductivity type opposite to that of the third conductive region, the first, second, third, and fourth conductive regions having the same conductivity type.

According to still another aspect of the present invention, there is provided a semiconductor device having a transistor, the transistor having: a gate formed on a semiconductor substrate via an insulating film; a first conductive region formed in a surface region of the semiconductor substrate on one side of the gate; a second conductive region formed in the surface region of the semiconductor substrate on the other side of the gate; a third conductive region formed at least in the surface region of the semiconductor substrate between the first conductive region and a lower portion on one side of the gate of the transistor; and a fourth conductive region formed at least in the surface region of the semiconductor substrate between the second conductive region and a lower portion on the other side of the gate of the transistor, the first, second, and third conductive regions having the same conductivity type while the fourth conductive region having a conductivity type opposite to that of the third conductive region, and the third conductive region having a resistance higher than that of the first conductive region.

In the present invention, when static electricity flows into the drain of the MOS transistor having the input protection function, breakdown can be generated at an appropriate voltage higher than the normal operating voltage and lower than the withstand strength of the gate oxide film because the junction withstand strength is suppressed low by the impurity diffusion layer having a conductivity type opposite to that of the drain.

When the region of the opposite conductivity type is formed only in part of the drain of the MOS transistor having the input protection function along the longitudinal direction of the gate, the MOS transistor can have both the normal MOS transistor function and the input protection function.

In the present invention, the gate electrode of the MOS transistor having the input protection function is patterned and formed in two steps, and impurities having opposite conductivity types are doped before and after the second patterning, respectively. With this process, an impurity having a conductivity type opposite to that of an impurity which has been ion-implanted before the second patterning can be ion-implanted into the surface region of the semiconductor substrate which is exposed by the second patterning. Therefore, the CMOS transistor can be formed by the split gate method simultaneously with formation of the MOS transistor having the input protection function.

According to the present invention, an input protective circuit (and an operation circuit having an input protection function) efficiently formed simultaneously with the CMOS transistor by the split gate method, and also having a high withstand strength and high-level functions can be realized.

DETAILED DESCRIPTION OF THE PREFERRED EMBODIMENTS

Several embodiments to which the present invention is applied will be described in detail with reference to the accompanying drawings.

First Embodiment

The first embodiment will be described first. In the first embodiment, a CMOS transistor and its input protective circuit will be exemplified as a semiconductor device, and the structure thereof will be described together with the manufacturing method. In the first embodiment, the input protective circuit is manufactured by the split gate method together with the CMOS transistor. FIGS. 1A to 1E are schematic sectional views showing the steps in manufacturing the semiconductor device according to the first embodiment of the present invention.

Figure 1A:
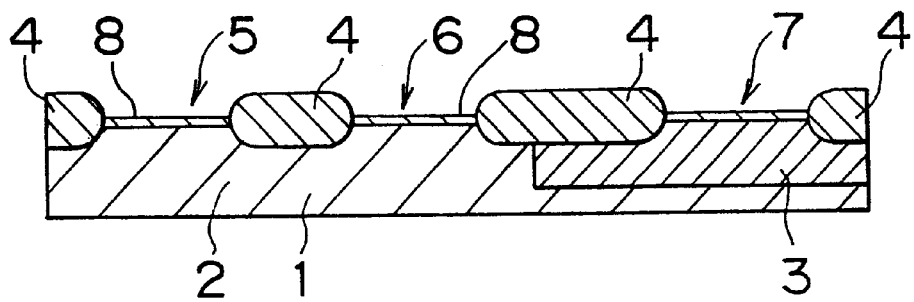
FIGS. 1A to 1E are schematic sectional views showing the steps in manufacturing a semiconductor device according to the first embodiment.

As shown in FIG. 1A, an n-type impurity is doped into a predetermined portion of a p-type silicon semiconductor substrate 1 by, e.g., ion implantation to form an n-type well 3. A region of the silicon semiconductor substrate 1 except the n-type well 3 becomes a p-type well 2.

Selective oxidation is performed by so-called LOCOS to form a field oxide film 4 as an element isolation structure on the silicon semiconductor substrate 1. At this time, the field oxide film 4 defines element formation regions 5 and 6 on the p-type well 2, and an element formation region 7 on the n-type well 3. As the element isolation structure, not the field oxide film 4 but a field shield element isolation structure may be formed by burying a conductive film in an insulating film to fix the potential of the corresponding portion of the silicon semiconductor substrate 1 below.

The element formation regions 5 to 7 are thermally oxidized to form gate oxide films 8 on the surfaces of the respective regions.

Figure 1B:
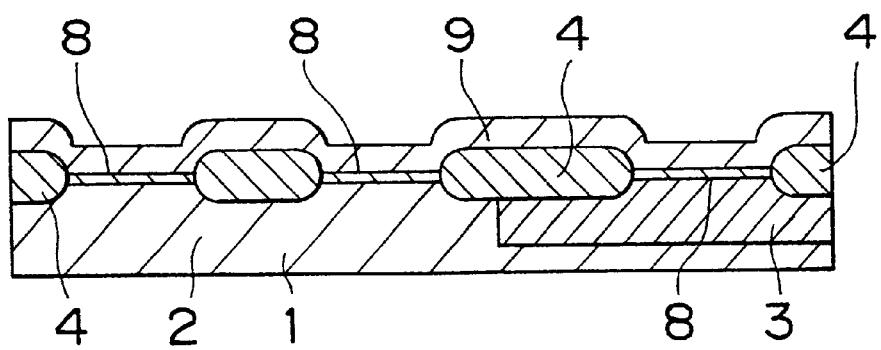

As shown in FIG. 1B, a polysilicon film 9 doped with phosphorus (P) as an n-type impurity is deposited on the entire surface including the field oxide film 4 by CVD.

Figure 1C:
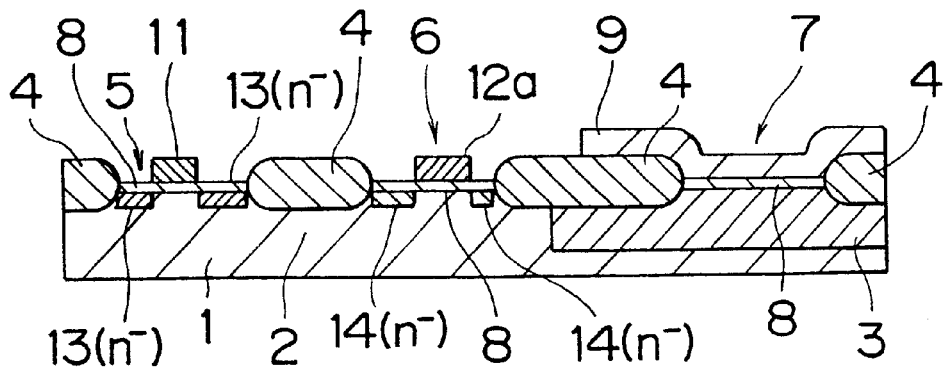

As shown in FIG. 1C, the polysilicon film 9 is subjected to photolithography and dry etching to form a gate electrode 11 having a predetermined shape on the element formation region 5 and a gate electrode pattern 12a having a predetermined shape on the element formation region 6. The gate electrode pattern 12a is formed such that its central portion on the element formation region 6 is shifted to the element formation region 7 side. In addition, the polysilicon film 9 is left across the element formation region 7 and the field oxide film 4 near the element formation region 7.

Phosphorus (P) as an n-type impurity is ion-implanted into the entire surface at a dose of $3\times10^{13}$ ($1/cm^2$) and an acceleration energy of 20 to 30 (keV) using, as a mask, the gate electrodes 11 and 12a on the element formation regions 5 and 6 and the polysilicon film 9 left on the element formation region 7. With this process, a pair of lightly doped diffusion layers 13 ($n^-$ type) are formed in the surface region of the p-type well 2 on both sides of the gate electrode 11, and a pair of lightly doped diffusion layers 14 ($n^-$ type) are formed in the surface region of the p-type well 2 on both sides of the gate electrode pattern 12a. At this time, one lightly doped diffusion layer 14 (serving as a drain) on the element formation region 7 side has a smaller width than that of the other lightly doped diffusion layer 14.

Figure 1D:
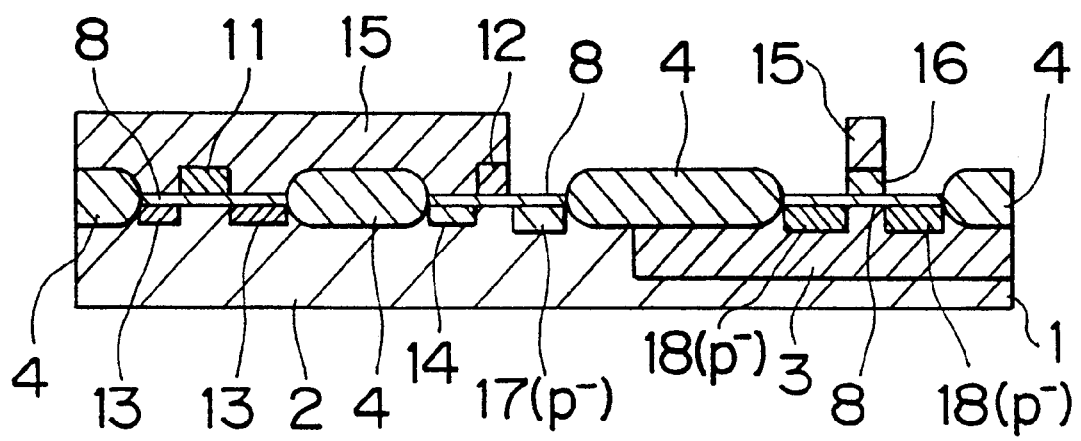

As shown in FIG. 1D, a photoresist is applied to the entire surface, and a resist mask 15 is formed by photolithography. The resist mask 15 is formed across the element formation regions 5 and 6 except a portion of the gate electrode pattern 12a on the element formation region 7 side, and also formed into a gate electrode shape on the element formation region 7. That is, the gate electrode pattern 12a is exposed on the element active region 7 side.

Dry etching is performed using the resist mask 15 as a mask. With this process, the part of gate electrode pattern 12a on the element formation region 6, which is exposed without being covered with the resist mask 15, is removed to form a gate electrode 12 on the element formation region 6, and simultaneously, a gate electrode 16 is formed on the element formation region 7.

$BF_2$ as a p-type impurity is ion-implanted into the entire surface at a dose of 4 to $5\times10^{13}$ ($1/cm^2$) and an acceleration energy of 50 to 70 (keV) using the resist mask 15 as a mask for ion implantation. At this time, the ions are repelled by the lightly doped diffusion layer 14 on the element formation region 7 side to form a lightly doped diffusion layer 17 having an opposite conductivity type (i.e., $p^-$ type) in the element formation region 6. At the same time, lightly doped diffusion layers 18 ($p^-$ type) are formed in the surface region of the n-type well 3 on both sides of the gate electrode 16 in the element formation region 7.

With this process, the lightly doped diffusion layers 18 ($p^-$ type) are formed on the element formation region 7, and p-type lightly doped diffusion layer 17 can be simultaneously formed on the element formation region 7 side of the gate electrode 12 in the element active region 6.

Figure 1E:
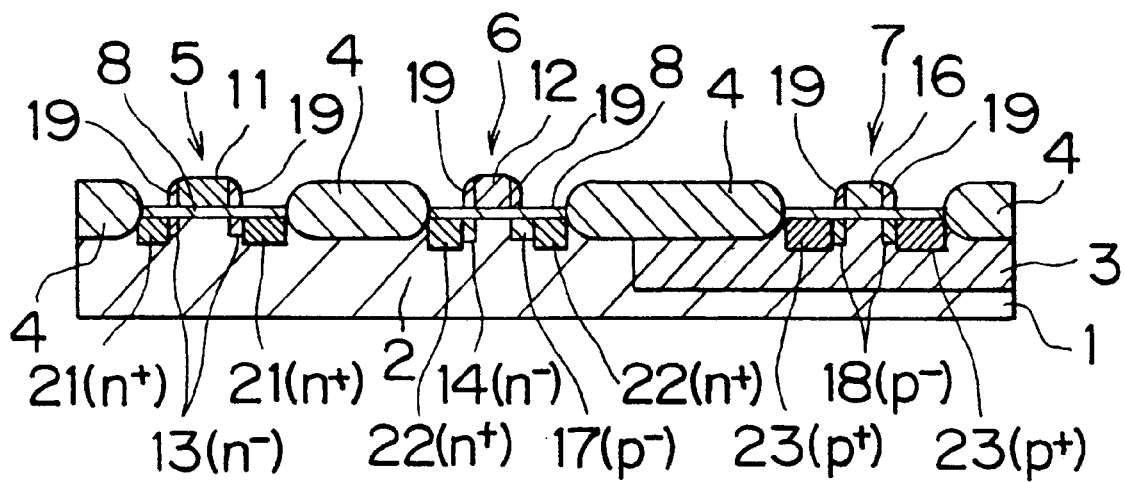

As shown in FIG. 1E, after the resist mask 15 is removed by, e.g., ashing, a silicon oxide film is deposited on the entire surface. The entire surface of the silicon oxide film is subjected to anisotropic dry etching to leave the silicon oxide film only on the side surfaces of the gate electrodes 11, 12, and 16, thereby forming side walls 19.

A resist mask is formed on the n-type well 3 by photolithography so as to cover the element formation region 7. Arsenic (As) as an n-type impurity is ion-implanted into the element formation regions 5 and 6 at a dose of $5\times10^{15}$ to $1\times10^{16}$ ($1/cm^2$) and an acceleration energy of 60 to 70 (keV) using the resist mask as a mask.

With this process, heavily doped diffusion layers 21 (n+ type) connected to the lightly doped diffusion layers 13 are formed in the element formation region 5, and heavily doped diffusion layers 22 (n+ type) connected to the lightly doped diffusion layers 14 and 17, respectively, are formed in the element formation region 6.

More specifically, since the side walls 19 function as a mask for ion implantation, the heavily doped impurity diffusion layers 22 in the element formation region 6 can be spaced apart from the gate electrodes 11 and 12. Hence, the lightly doped diffusion layer 17 can be left in the element formation region 6 between the heavily doped impurity diffusion layer 22 and the lower portion of the gate electrode 12.

Figure 2:
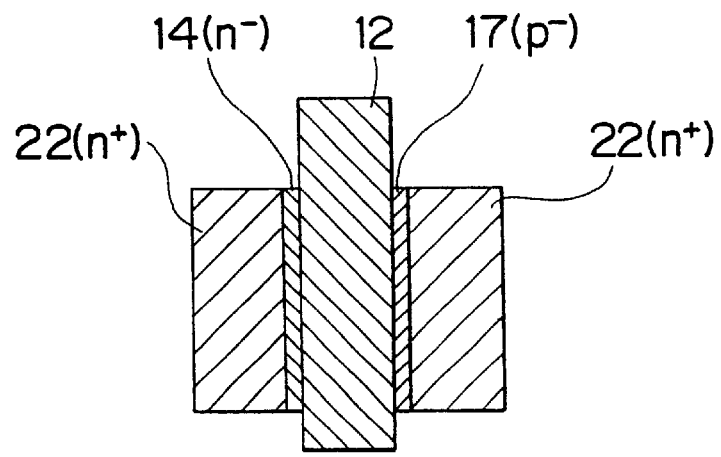
FIG. 2 is a schematic plan view showing a structure near the gate electrode of the input protective circuit of the semiconductor device according to the first embodiment.
Figure 3:
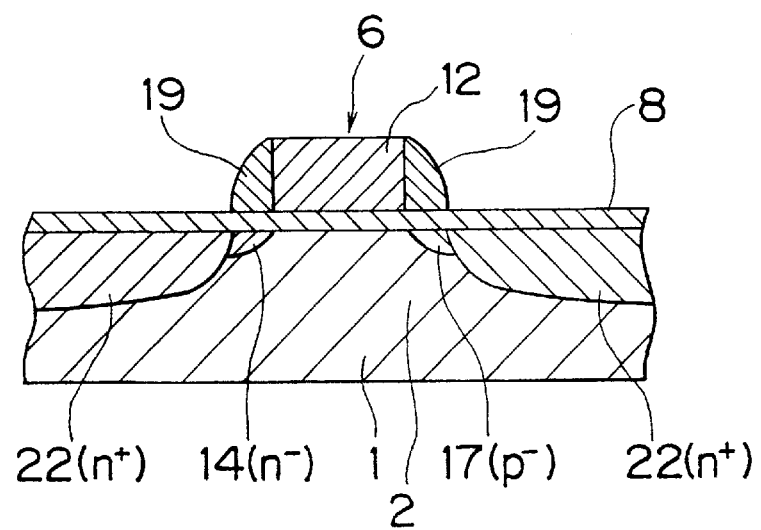
FIG. 3 is a schematic sectional view showing the structure near the gate electrode of the input protective circuit of the semiconductor device according to the first embodiment.

FIGS. 2 and 3 show the element formation region 6 (the side walls 19 are not illustrated) at this time. On the element formation region 5 side of the band-shaped gate electrode 12, the heavily doped diffusion layer 22 is formed via the lightly doped diffusion layer 14 and connected to the lightly doped diffusion layer 14. On the element formation region 7 side of the gate electrode 12, the heavily doped diffusion layer 22 is formed via the lightly doped diffusion layer 17 and connected to the lightly doped diffusion layer 17.

Figure 4:
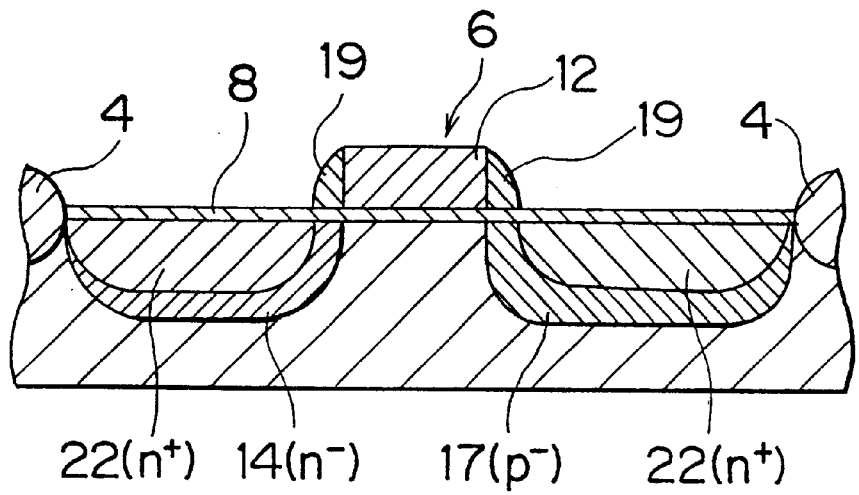
FIG. 4 is a schematic sectional view showing a structure near the gate electrode of the input protective circuit of another example of the semiconductor device according to the first embodiment.

As for the lightly doped diffusion layer 14 and the heavily doped diffusion layer 22 as the source of the gate electrode 12 and the lightly doped diffusion layer 17 and the heavily doped diffusion layer 22 as the drain of the gate electrode 12, the heavily doped diffusion layers 22 may be formed such that they are covered with the lightly doped diffusion layers 14 and the lightly doped diffusion layer 17, respectively, in the p-type well 2, as shown in FIG. 4. More specifically, ion implantation in forming the heavily doped diffusion layers 22 may be performed at a dose of, e.g., 1 to $3 \times 10^{15}$ $(1/cm^2)$ and an acceleration energy of 50 to 60 (keV).

After the resist mask is removed by, e.g., ashing, a resist mask is formed on the p-type well 2 by photolithography so as to cover the element formation regions 5 and 6. BF2 as a p-type impurity is ion-implanted into the element formation region 7 at a dose of 3 to $5 \times 10^{15}$ $(1/cm^2)$ and acceleration energy of 65 to 70 (keV) using the resist mask as a mask, thereby forming heavily doped diffusion layers 23 (p+ type) connected to the lightly doped diffusion layers 18 in the element formation region 7.

An nMOS transistor is constituted by the gate electrode 11 formed on the element formation region 5 and the lightly doped diffusion layers 13 and heavily doped diffusion layers 21 (serving as a source and drain) on both sides of the gate electrode 11, and a pMOS transistor is constituted by the gate electrode 16 formed on the element formation region 7 and the lightly doped diffusion layers 18 and heavily doped diffusion layers 23 (serving as a source and drain) on both sides of the gate electrode 16, thus constituting a CMOS transistor. In addition, the input protective circuit of the CMOS transistor is constituted by the gate electrode 12, the lightly doped diffusion layer 14 and heavily doped diffusion layer 22 (serving as a source), and the lightly doped diffusion layer 17 and heavily doped diffusion layer 22 (serving as a drain). FIG. 3 is an enlarged view of the input protective circuit.

The order of ion implantation on the p-type well 2 side and ion implantation on the n-type well 3 side may be reversed.

Thereafter, an insulating interlayer or various interconnections are formed, thereby completing the semiconductor device of the first embodiment.

Figure 5:
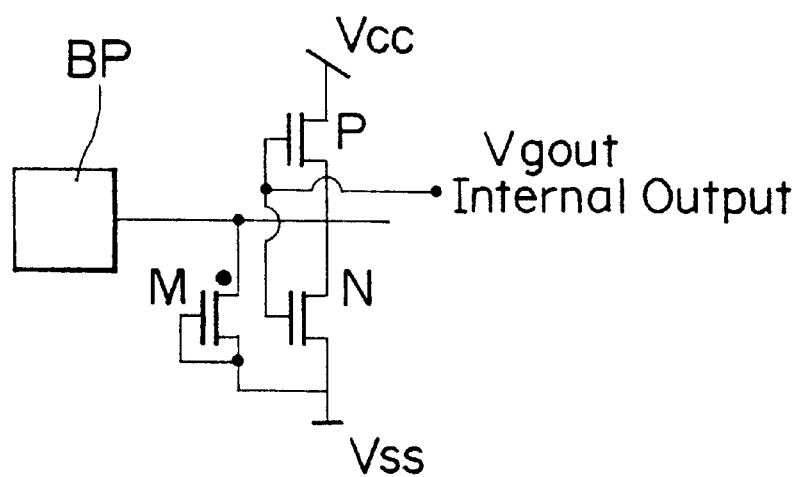
FIG. 5 is an equivalent circuit diagram of the semiconductor device according to the first embodiment.
Figure 6:
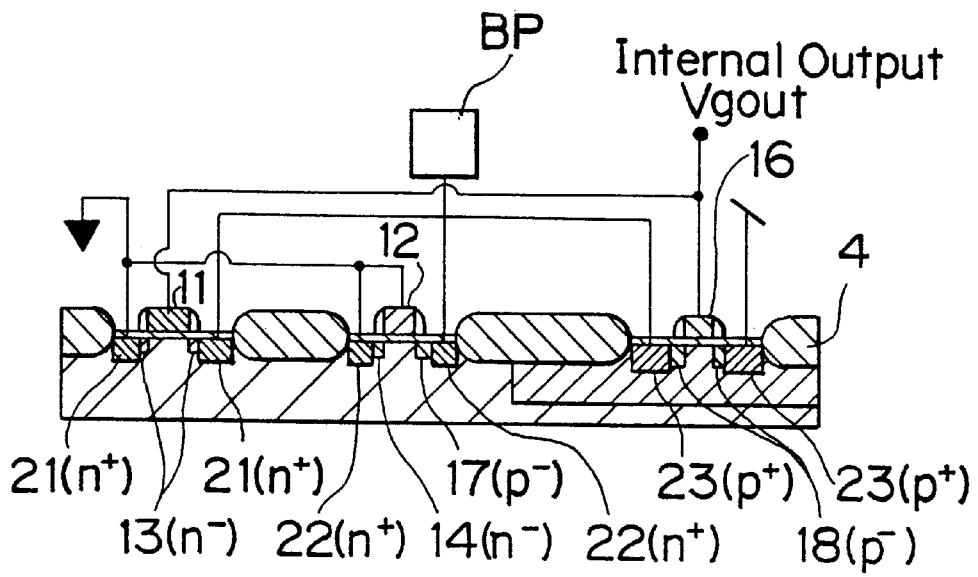
FIG. 6 is a schematic sectional view showing the connection state of the semiconductor device according to the first embodiment.

FIG. 5 is an equivalent circuit diagram of the CMOS transistor and input protective circuit according to the first embodiment. FIG. 6 is a schematic view showing the connection state and section. The nMOS transistor of the CMOS transistor is represented by N; the pMOS transistor, P; and the transistor of the input protective circuit, M. As described above, the drain of the transistor M is formed by joining the n+-type heavily doped diffusion layer 22 and the p+-type lightly doped diffusion layer 17 and directly connected to a bonding pad BP (indicated by ● in FIG. 5).

Therefore, if this drain receives static electricity, breakdown occurs at an appropriate voltage which is higher than a normal operating voltage Vcc and lower than the withstand strength of the gate oxide film 8 of the nMOS transistor N or pMOS transistor P, so the surge current flows to the Vss side. The concentration ratio between the heavily doped diffusion layer 22 and the lightly doped diffusion layer 17 is preferably set on the order of 100 such that breakdown of the transistor M takes place at an appropriate voltage. In FIGS. 5 and 6, $V_{GOUT}$ represents the output from the internal circuit.

As described above, according to the first embodiment, an input protective circuit having an offset structure efficiently formed simultaneously with the CMOS transistor by the split gate method, and also having a high withstand strength and high-level functions is realized.

Figure 8:
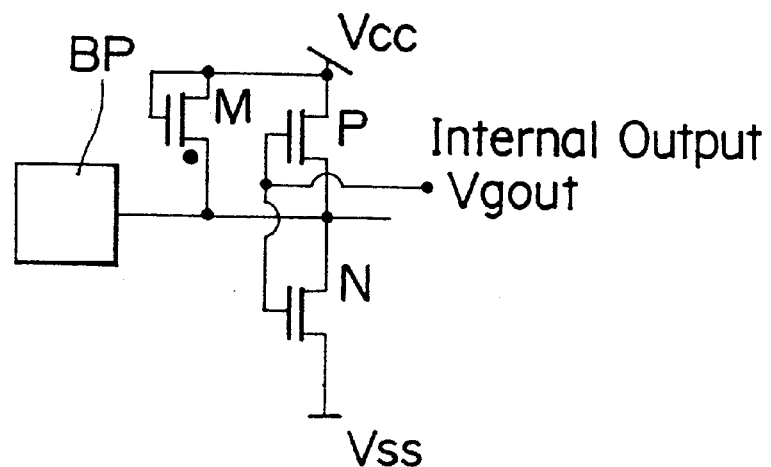
FIG. 8 is an equivalent circuit diagram of a modification of the semiconductor device according to the first embodiment.
Figure 9:
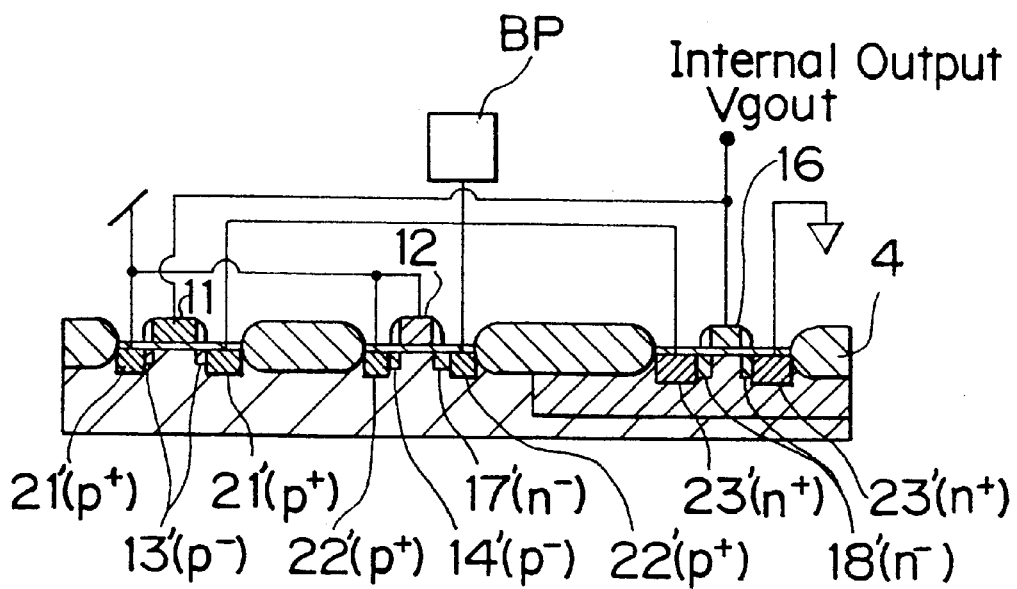
FIG. 9 is a schematic sectional view showing the connection state of the modification of the semiconductor device according to the first embodiment.

In the first embodiment, the conductivities of the above-described wells and impurity diffusion layers may be opposite to those described above. FIG. 8 is an equivalent circuit diagram of a CMOS transistor and its input protective circuit which have wells and impurity diffusion layers having opposite conductivities. FIG. 9 is a schematic view showing the connection state and section which illustrates through the use of prime reference numerals the change in conductivity.

Even when the wells and impurity diffusion layers have opposite conductivities, the same effect as in the first embodiment can be obtained.

Second Embodiment

The second embodiment will be described next. In the second embodiment, a CMOS transistor and its input protective circuit will be exemplified as a semiconductor device, and the structure thereof will be described together with the manufacturing method. The second embodiment is almost the same as the first embodiment except that the input protective circuit is formed from a field transistor. FIGS. 10A to 10E are schematic sectional views showing the steps in manufacturing the semiconductor device according to the second embodiment of the present invention. The same reference numerals as in the first embodiment denote the same members in the second embodiment.

As shown in FIG. 1A, an n-type well 3, a p-type well 2, and a field oxide film 4 are formed to define element formation regions 5 to 7 on a silicon semiconductor substrate 1, and a gate oxide film 8 is formed.

Figure 10A:
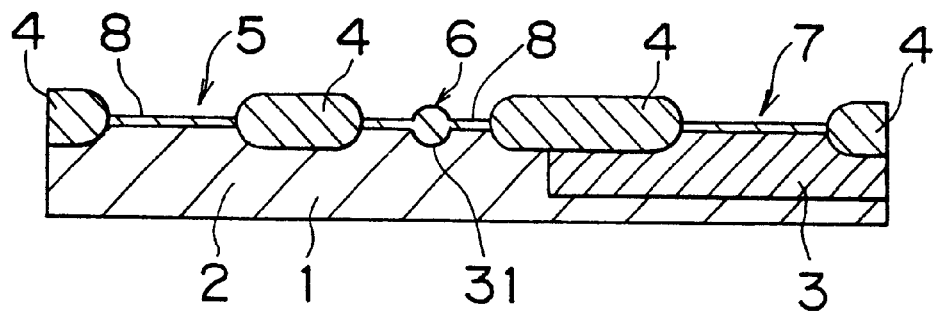
FIGS. 10A to 10E are schematic sectional views showing the steps in manufacturing a semiconductor device according to the second embodiment.

As shown in FIG. 10A, the gate oxide film 8 at the central portion of the element formation region 6 is selectively oxidized by the same technique as the above-described LOCOS to form a field oxide film 31 having a predetermined thickness. The field oxide film 31 may be formed by LOCOS simultaneously with the field oxide film 4.

Figure 10B:
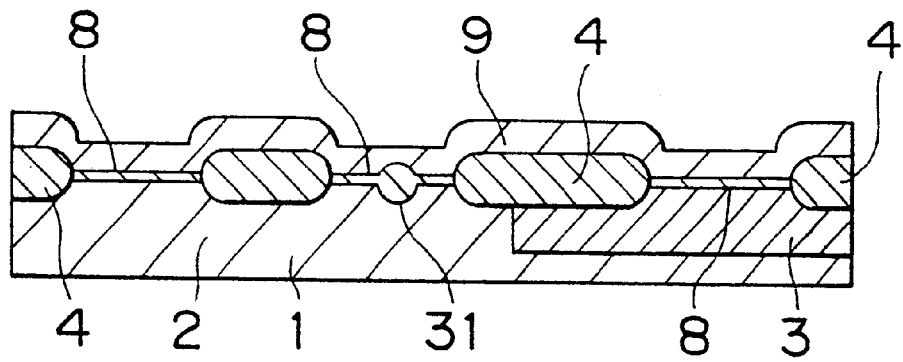

As shown in FIG. 10B, a polysilicon film 9 doped with phosphorus (P) as an n-type impurity is deposited on the entire surface including the field oxide film 4 by CVD.

Figure 10C:
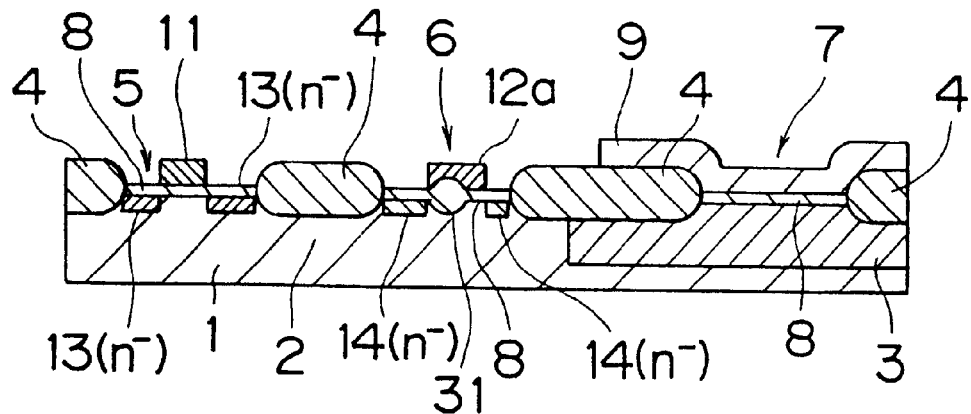

As shown in FIG. 10C, the polysilicon film 9 is subjected to photolithography and dry etching to form a gate electrode 11 having a predetermined shape on the element formation region 5 and a gate electrode pattern 12a having a predetermined shape on the element formation region 6. The gate electrode pattern 12a is formed such that it covers the field oxide film 31, and its central portion on the element formation region 6 is shifted to the element formation region 7 side. In addition, the polysilicon film 9 is left across the element formation region 7 and the field oxide film 4 near the element formation region 7.

Phosphorus (P) as an n-type impurity is ion-implanted into the entire surface at a dose of $3 \times 10^{13}$ $(1/cm^2)$ and an acceleration energy of 20 to 30 (keV) using, as a mask, the gate electrodes 11 and 12a on the element formation regions 5 and 6 and the polysilicon film 9 left on the element formation region 7. With this process, a pair of lightly doped diffusion layers 13 (n⁻ type) are formed in the surface region of the p-type well 2 on both sides of the gate electrode 11, and a pair of lightly doped diffusion layers 14 (n⁻ type) are formed in the surface region of the p-type well 2 on both sides of the gate electrode pattern 12a. At this time, one lightly doped diffusion layer 14 (serving as a drain) on the element formation region 7 side has a smaller width than that of the other lightly doped diffusion layer 14.

Figure 10D:
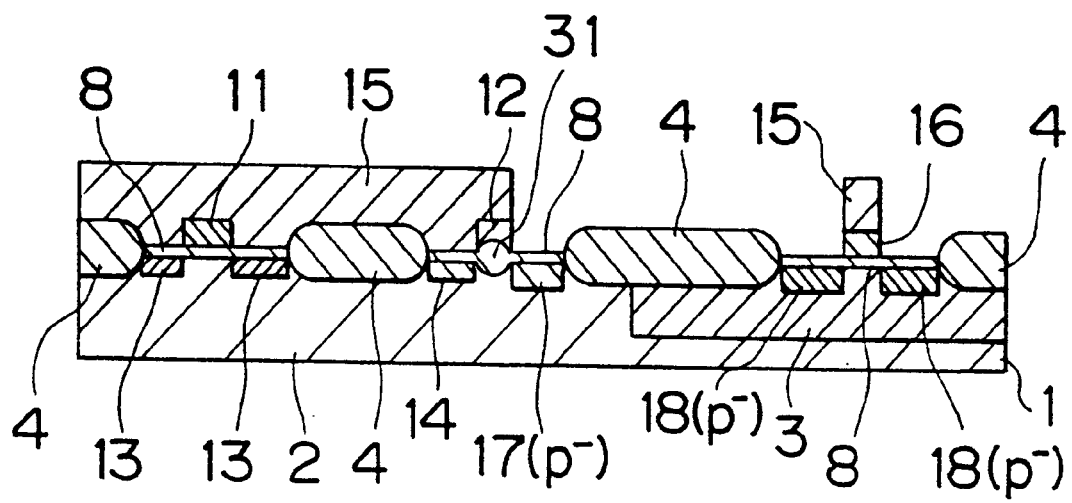

As shown in FIG. 10D, a photoresist is applied to the entire surface, and a resist mask 15 is formed by photolithography. The resist mask 15 is formed across the element formation regions 5 and 6 except a portion of the gate electrode pattern 12a on the element formation region 7 side, and also formed into a gate electrode shape on the element formation region 7. That is, the gate electrode pattern 12a is exposed on the element active region 7 side.

Dry etching is performed using the resist mask 15 as a mask. With this process, the part of gate electrode pattern 12a on the element formation region 6, which is exposed without being covered with the resist mask 15, is removed to form a gate electrode 12 on the element formation region 6, and simultaneously, a gate electrode 16 is formed on the element formation region 7.

$BF_2$ as a p-type impurity is ion-implanted into the entire surface at a dose of 4 to $5 \times 10^{13}$ (1/cm²) and an acceleration energy of 50 to 70 (keV) using the resist mask 15 as a mask for ion implantation. At this time, the ions are repelled by the lightly doped diffusion layer 14 on the element formation region 7 side to form a lightly doped diffusion layer 17 having an opposite conductivity type (i.e., p⁻ type) in the element formation region 6. At the same time, lightly doped diffusion layers 18 (p⁻ type) are formed in the surface region of the n-type well 3 on both sides of the gate electrode 16 in the element formation region 7.

With this process, the lightly doped diffusion layers 18 (p⁻ type) are formed in the element formation region 7, and the p-type lightly doped diffusion layer 17 can be simultaneously formed in the element formation region 7 side of the gate electrode 12 in the element active region 6.

Figure 10E:
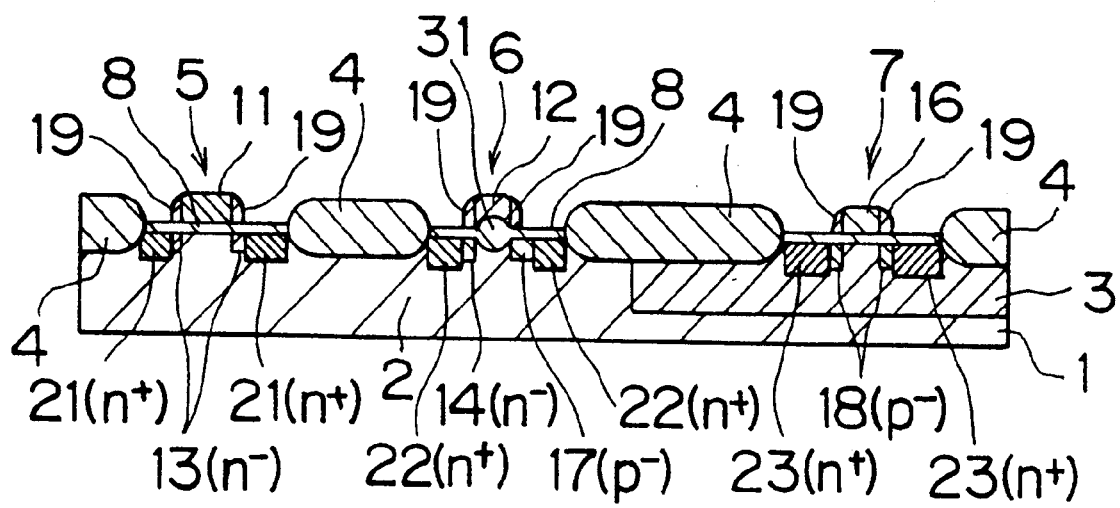

As shown in FIG. 10E, after the resist mask 15 is removed by, e.g., ashing, a silicon oxide film is deposited on the entire surface. The entire surface of the silicon oxide film is subjected to anisotropic dry etching to leave the silicon oxide film only on the side surfaces of the gate electrodes 11, 12, and 16, thereby forming side walls 19.

A resist mask is formed on the n-type well 3 by photolithography so as to cover the element formation region 7. Arsenic (As) as an n-type impurity is ion-implanted into the element formation regions 5 and 6 at a dose of $5 \times 10^{15}$ to $1 \times 10^{16}$ (1/cm²) and an acceleration energy of 60 to 70 (keV) using the resist mask as a mask.

With this process, heavily doped diffusion layers 21 (n⁺ type) connected to the lightly doped diffusion layers 13 are formed in the element formation region 5, and heavily doped diffusion layers 22 (n⁺ type) connected to the lightly doped diffusion layers 14 and 17, respectively, are formed in the element formation region 6.

More specifically, since the side walls 19 function as a mask for ion implantation, the heavily doped impurity diffusion layers 22 in the element formation region 6 can be spaced apart from the gate electrodes 11 and 12. Hence, the lightly doped diffusion layer 17 can be left in the element formation region 6 between the heavily doped impurity diffusion layer 22 and the lower portion of the gate electrode 12.

The state of the element formation region 6 at this time is the same as that shown in FIG. 2. On the element formation region 5 side of the band-shaped gate electrode 12, the heavily doped diffusion layer 22 is formed via the lightly doped diffusion layer 14 and connected to the lightly doped diffusion layer 14. On the element formation region 7 side of the gate electrode 12, the heavily doped diffusion layer 22 is formed via the lightly doped diffusion layer 17 and connected to the lightly doped diffusion layer 17.

After the resist mask is removed by, e.g., ashing, a resist mask is formed on the p-type well 2 by photolithography so as to cover the element formation regions 5 and 6. $BF_2$ as a p-type impurity is ion-implanted into the element formation region 7 at a dose of 3 to $5 \times 10^{15}$ (1/cm²) and acceleration energy of 65 to 70 (keV) using the resist mask as a mask, thereby forming heavily doped diffusion layers 23 (p⁺ type) connected to the lightly doped diffusion layers 18 on the element formation region 7.

An nMOS transistor is constituted by the gate electrode 11 formed on the element formation region 5 and the lightly doped diffusion layers 13 and heavily doped diffusion layers 21 (serving as a source and drain) on both sides of the gate electrode 11, and a pMOS transistor is constituted by the gate electrode 16 formed on the element formation region 7 and the lightly doped diffusion layers 18 and heavily doped diffusion layers 23 (serving as a source and drain) on both sides of the gate electrode 16, thus constituting a CMOS transistor. In addition, the field transistor (nMOS transistor) as the input protective circuit of the CMOS transistor is constituted by the gate electrode 12 on the field oxide film 31, the lightly doped diffusion layer 14 and heavily doped diffusion layer 22 (serving as a source), and the lightly doped diffusion layer 17 and heavily doped diffusion layer 22 (serving as a drain).

The order of ion implantation on the p-type well 2 side and ion implantation on the n-type well 3 side may be reversed.

Thereafter, an insulating interlayer or various interconnections are formed, thereby completing the semiconductor device of the second embodiment.

The equivalent circuit of the CMOS transistor and field transistor according to the second embodiment is the same as that shown in FIG. 5. The nMOS transistor of the CMOS transistor is represented by N; the pMOS transistor, P; and the field transistor, M. As described above, the drain of the field transistor M is formed by joining the n⁺-type heavily doped diffusion layer 22 and the p⁻-type lightly doped diffusion layer 17 and converting the gate oxide film 8 of the field transistor M into the thick field oxide film 31 and directly connected to a bonding pad BP (indicated by ● in FIG. 5). Therefore, if this drain receives static electricity, breakdown occurs at an appropriate voltage which is higher than a normal operating voltage Vcc and lower than the withstand strength of the gate oxide film 8 of the nMOS transistor N or pMOS transistor P, so the surge current flows to the Vss side. The concentration ratio between the heavily doped diffusion layer 22 and the lightly doped diffusion layer 17 is preferably set on the order of 100 such that breakdown of the transistor M takes place at an appropriate voltage. To cause breakdown at an appropriate voltage, the thickness of the field oxide film 31 is preferably 3,000 to 5,000 Å.

As described above, according to the second embodiment, an input protective circuit (field transistor) having an offset structure efficiently formed simultaneously with the CMOS transistor by the split gate method, and also having a high withstand strength and high-level functions is realized, as in the first embodiment.

Third Embodiment

The third embodiment will be described next. In the third embodiment, a CMOS transistor and a first input/output-side transistor will be exemplified as a semiconductor device, and the structure thereof will be described together with the manufacturing method. The third embodiment is almost the same as the first and second embodiments except that the present invention is applied not to an input protective circuit but to an operation circuit also serving as an input protective circuit. FIGS. 11A to 11E and 12A to 12E are schematic sectional views showing the steps in manufacturing the semiconductor device according to the third embodiment. FIGS. 13A to 13D are schematic plan views showing the steps in manufacturing the semiconductor device according to the third embodiment. FIGS. 11A to 11E are schematic sectional views taken along an alternate long and short dashed line I—I in FIGS. 13A to 13D. FIGS. 12A to 12E are schematic sectional views taken along an alternate long and short dashed line II—II in FIGS. 13A to 13D. FIGS. 14A and 14B are sectional views showing part of the semiconductor device in FIGS. 12A to 12E in detail. The same reference numerals as in the first embodiment denote the same members in the third embodiment.

Figure 11A:
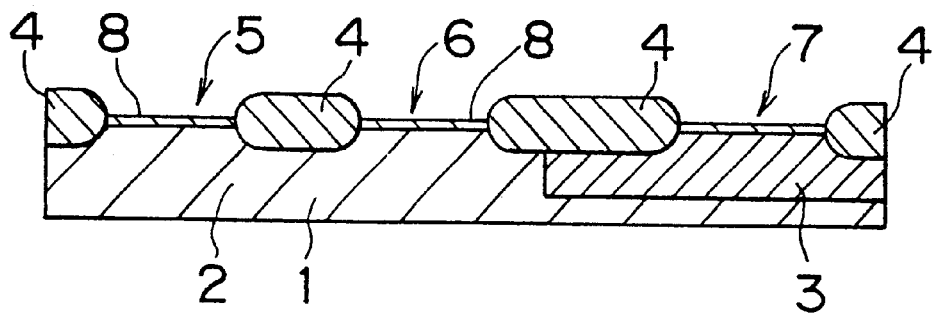
FIGS. 11A to 11E are schematic sectional views showing the steps in manufacturing a semiconductor device according to the third embodiment.
Figure 12A:
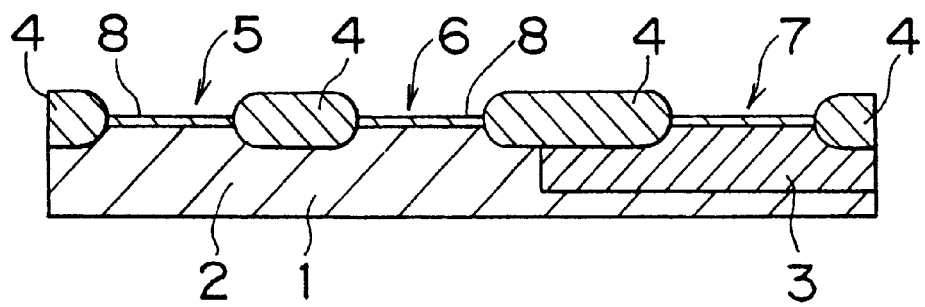
FIGS. 12A to 12E are schematic sectional views showing the steps in manufacturing the semiconductor device according to the third embodiment.

As shown in FIGS. 11A and 12A, an n-type well 3, a p-type well 2, and a field oxide film 4 are formed to define element formation regions 5 to 7 on a silicon semiconductor substrate 1, and a gate oxide film 8 is formed.

Figure 11B:
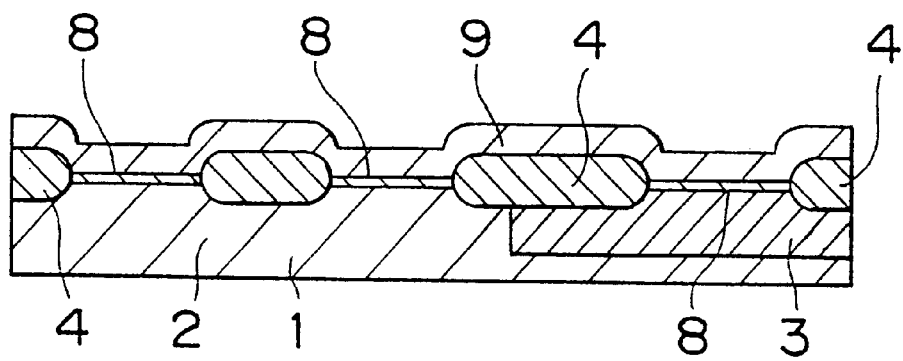
Figure 12B:
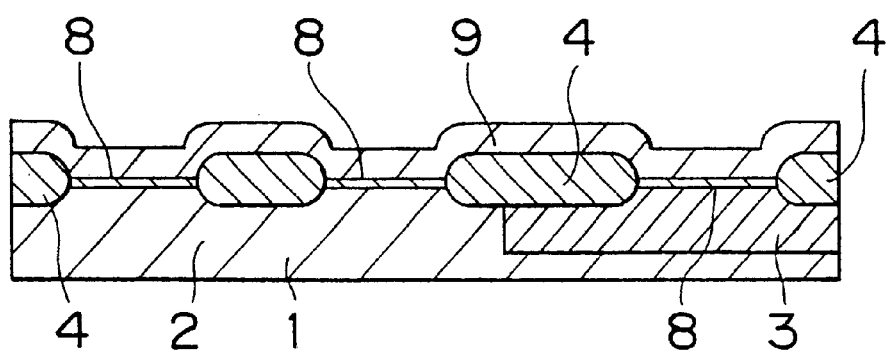

As shown in FIGS. 11B and 12B, a polysilicon film 9 doped with phosphorus (P) as an n-type impurity is deposited on the entire surface including the field oxide film 4 by CVD.

Figure 11C:
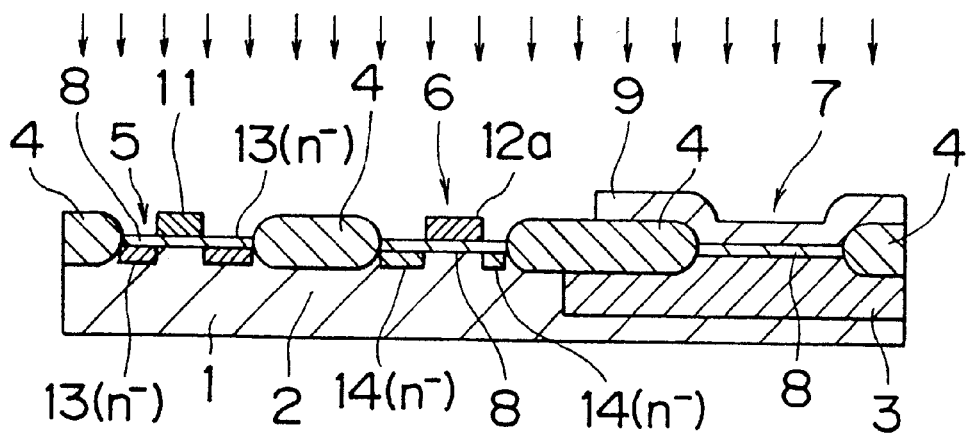
Figure 12C:
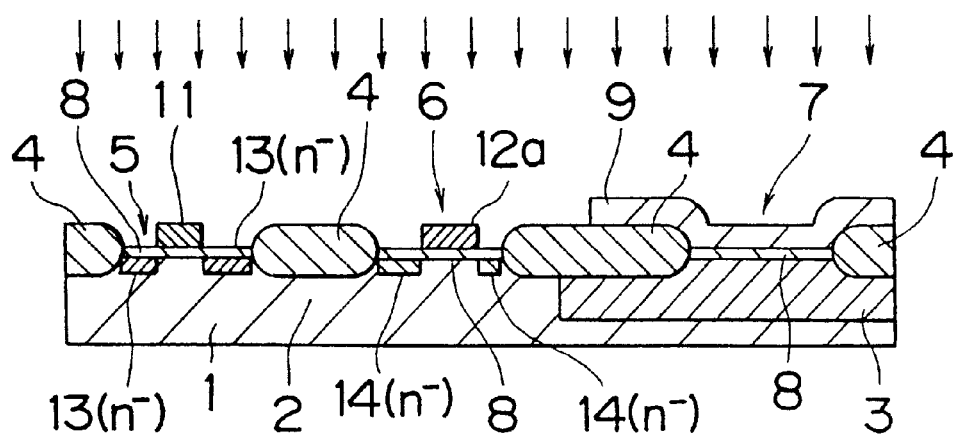

As shown in FIGS. 11C and 12C, the polysilicon film 9 is subjected to photolithography and dry etching to form a gate electrode 11 having a predetermined shape on the element formation region 5 and a gate electrode pattern 12$a$ having a predetermined shape on the element formation region 6. FIG. 11C is a sectional view taken along an alternate long and short dashed line I—I in FIG. 14A. The gate electrode pattern 12$a$ is formed such that its central portion on the element formation region 6 is shifted to the element formation region 7 side. In addition, the polysilicon film 9 is left across the element formation region 7 and the field oxide film 4 near the element formation region 7.

Phosphorus (P) as an n-type impurity is ion-implanted into the entire surface at a dose of $3 \times 10^{13}$ (1/cm$^2$) and an acceleration energy of 20 to 30 (keV) using, as a mask, the gate electrodes 11 and 12$a$ on the element formation regions 5 and 6 and the polysilicon film 9 left on the element formation region 7. With this process, a pair of lightly doped diffusion layers 13 (n$^-$ type) are formed in the surface region of the p-type well 2 on both sides of the gate electrode 11, and a pair of lightly doped diffusion layers 14 (n$^-$ type) are formed in the surface region of the p-type well 2 on both sides of the gate electrode pattern 12$a$. At this time, one lightly doped diffusion layer 14 (serving as a drain) on the element formation region 7 side has a smaller width than that of the other lightly doped diffusion layer 14.

Figure 11D:
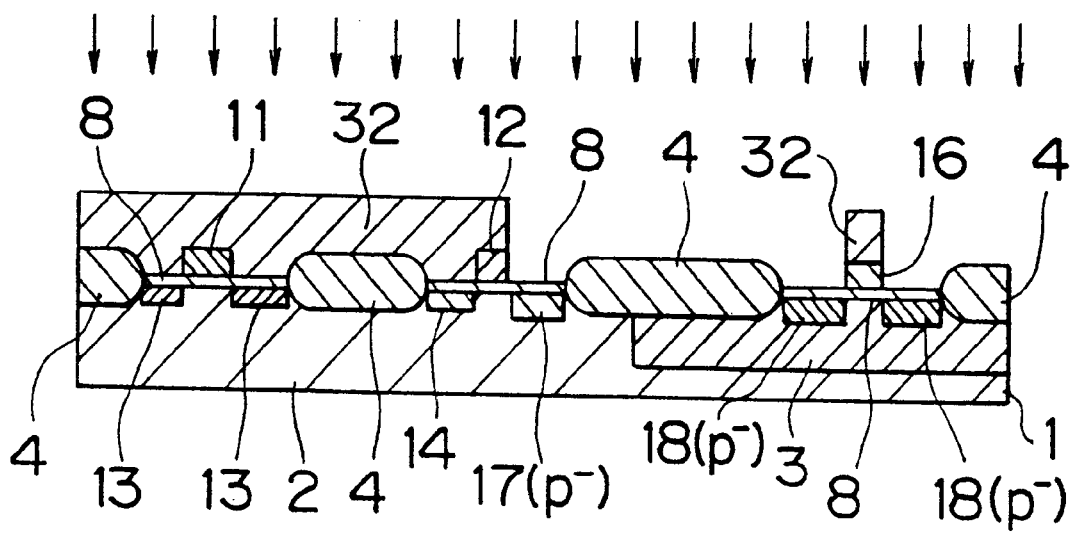
Figure 12D:
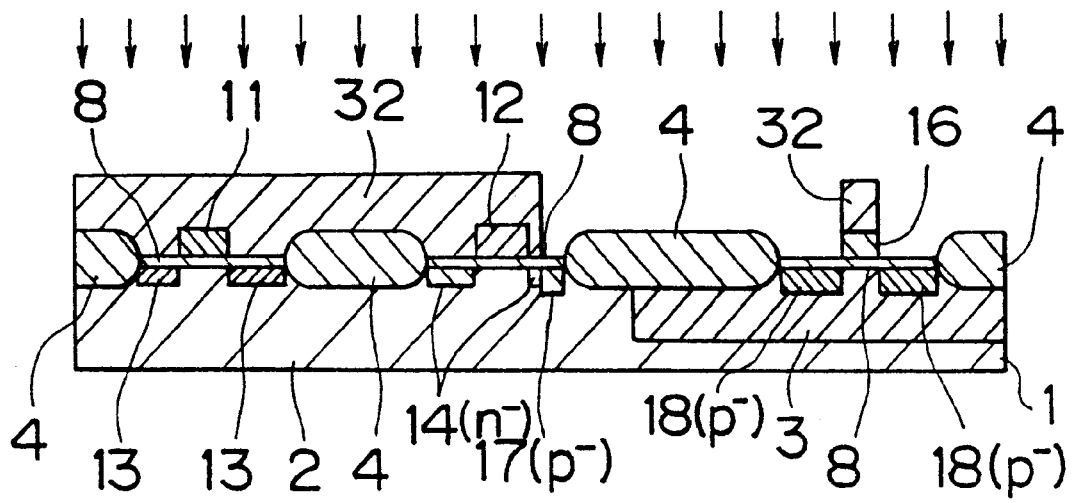
Figure 13A:
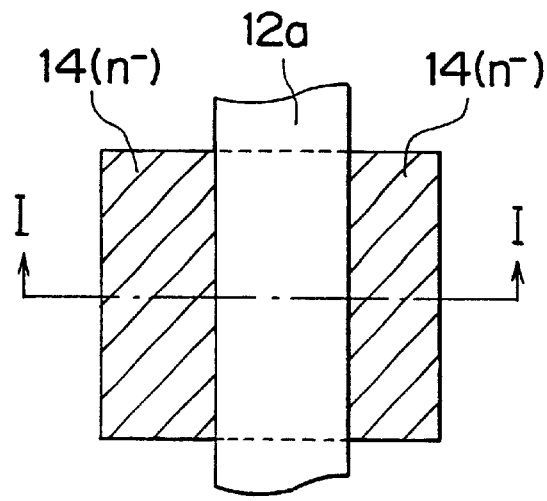
FIGS. 13A to 13D are schematic sectional views showing the steps in manufacturing the semiconductor device according to the third embodiment.
Figure 13B:
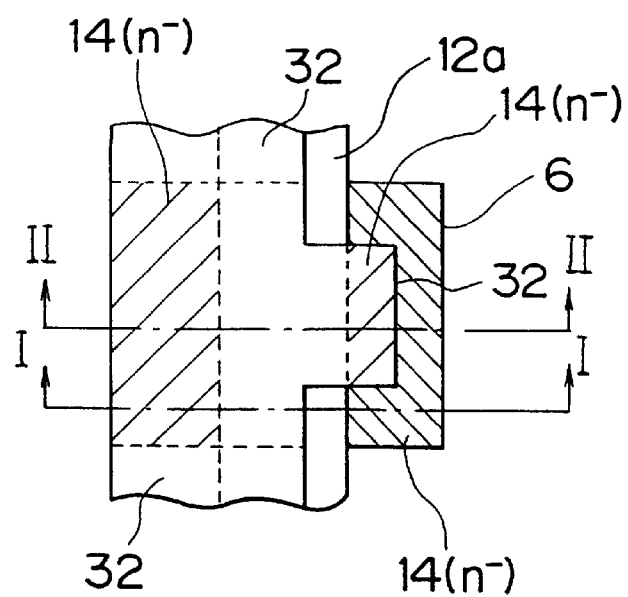
Figure 14A:
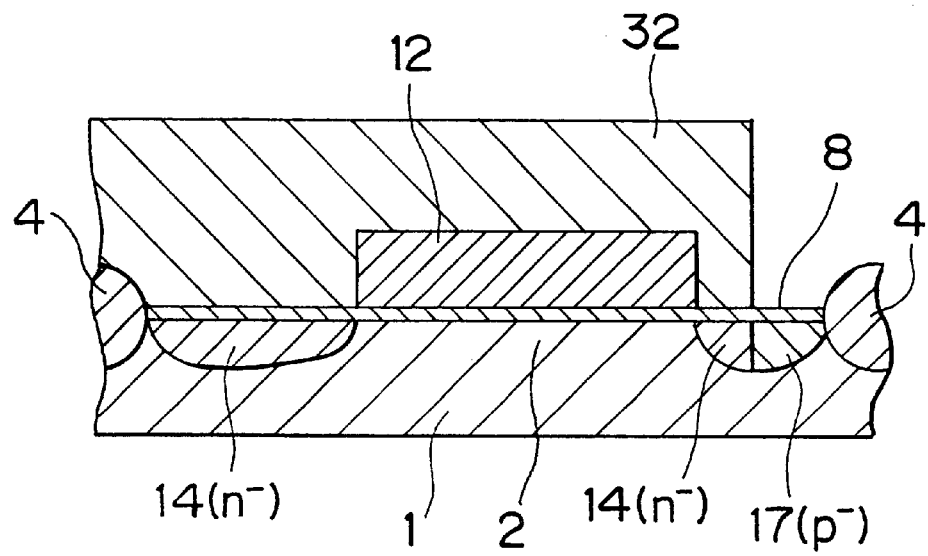
FIGS. 14A and 14B are schematic sectional views showing main steps in manufacturing the semiconductor device according to the third embodiment.
Figure 14B:
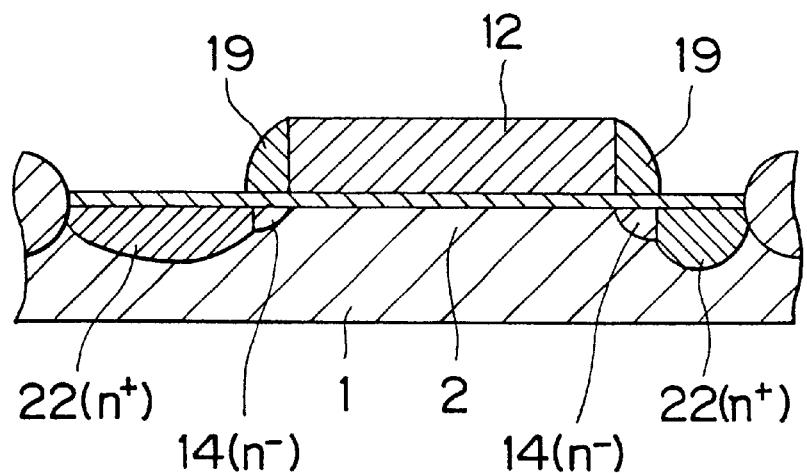

As shown in FIGS. 11D, 12D, and 13B, a photoresist is applied to the entire surface, and a resist mask 32 is formed by photolithography. FIG. 11D is a sectional view taken along an alternate long and short dashed line I—I in FIG. 13B. FIG. 12D is a sectional view taken along an alternate long and short dashed line II—II in FIG. 13B. As shown in FIGS. 12D and 13B, the resist mask 32 is formed at the central position of the element formation region 6 in the longitudinal direction of the gate electrode pattern 12$a$ such that the entire surface and side surfaces of the gate electrode pattern 12$a$ in the direction of gate width are covered. As shown in FIG. 13B, the resist mask 32 is formed at the end positions of the element formation region 6 in the longitudinal direction of the gate electrode pattern 12$a$ such that the gate electrode pattern 12$a$ on the element active region 7 side is exposed. The resist mask 32 is formed into a gate electrode shape on the element formation region 7.

Dry etching is performed using the resist mask 32 as a mask to partially remove the gate electrode pattern 12$a$ on the element formation region 6 to form a gate electrode 12 on the element formation region 6, and simultaneously, form a gate electrode 16 on the element formation region 7. The gate electrode 12 has a shape conforming to the resist mask 32, so a projecting portion 26 is formed on the element active region 7 side in the direction of gate width.

Figure 13C:
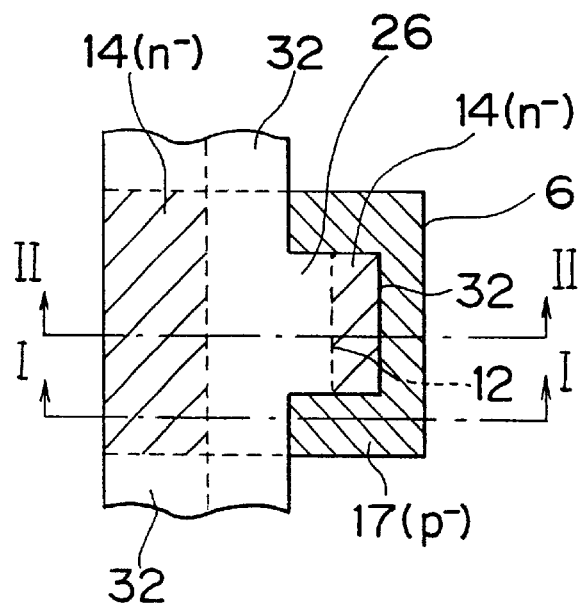

As shown in FIG. 13C, BF$_2$ as a p-type impurity is ion-implanted into the entire surface at a dose of 4 to $5 \times 10^{13}$ (1/cm$^2$) and an acceleration energy of 50 to 70 (keV) using the resist mask 32 as a mask for ion implantation. At this time, the ions are partially repelled by the lightly doped diffusion layer 14 on the element formation region 7 side to form a lightly doped diffusion layer 17 having an opposite conductivity type (i.e., p$^-$ type) in the element formation region 6. At the same time, lightly doped diffusion layers 18 (p$^-$ type) are formed in the surface region of the n-type well 3 on both sides of the gate electrode 16 in the element formation region 7. FIG. 14A is an enlarged view showing a portion near the element formation region 6 at this time shown in FIG. 12D. As shown in FIG. 14A, since the side surface of the gate electrode pattern 12$a$ is covered with the resist mask 32, the conductivity (n$^-$) of the lightly doped diffusion layer 14 immediately under that portion is kept unchanged.

With this process, the lightly doped diffusion layers 18 (p$^-$-type) are formed on the element formation region 7, and the p-type lightly doped diffusion layer 17 can be simultaneously formed on the element formation region 7 side of the gate electrode 12 in the element active region 6.

Figure 11E:
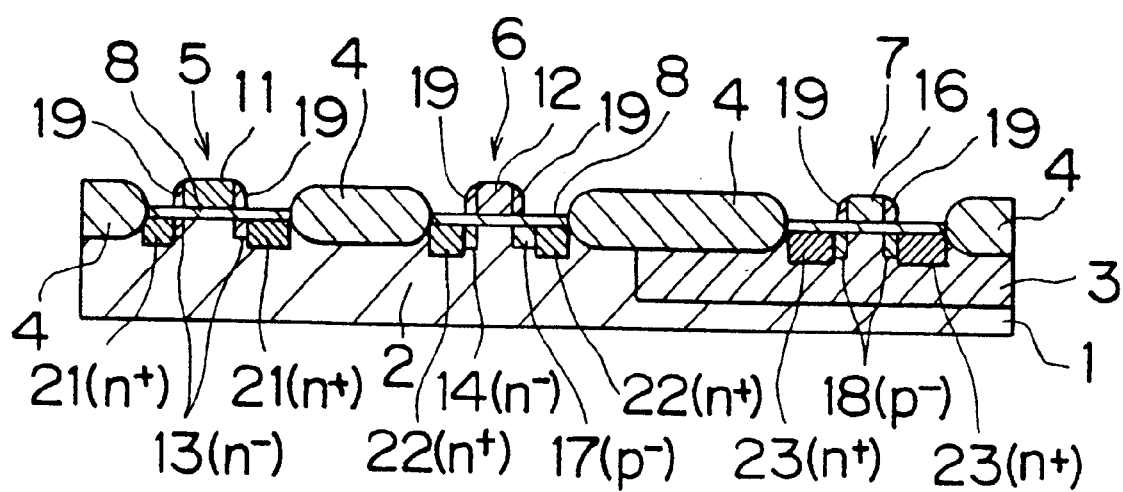
Figure 12E:
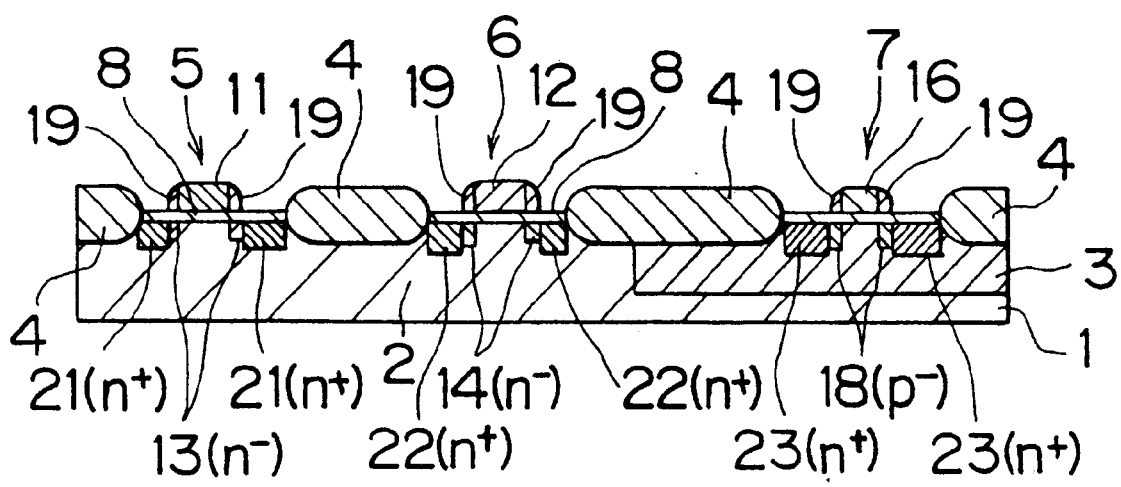

As shown in FIGS. 11E and 12E, after the resist mask 32 is removed by, e.g., ashing, a silicon oxide film is deposited on the entire surface. The entire surface of the silicon oxide film is subjected to anisotropic dry etching to leave the silicon oxide film only on the side surfaces of the gate electrodes 11, 12, and 16, thereby forming side walls 19. Preferably, the side walls cover the lightly doped impurity diffusion layers 14.

A resist mask is formed on the n-type well 3 by photolithography so as to cover the element formation region 7. Arsenic (As) as an n-type impurity is ion-implanted into the element formation regions 5 and 6 at a dose of $5 \times 10^{15}$ to $1 \times 10^{16}$ (1/cm$^2$) and an acceleration energy of 60 to 70 (keV) using the resist mask as a mask. With this process, heavily doped diffusion layers 21 (n$^+$ type) connected to the lightly doped diffusion layers 13 are formed in the element formation region 5, and heavily doped diffusion layers 22 (n$^+$ type) connected to the lightly doped diffusion layers 14 and 17, respectively, are formed in the element formation region 6.

More specifically, since the side walls 19 function as a mask for ion implantation, the heavily doped impurity diffusion layers 22 in the element formation region 6 can be spaced apart from the gate electrodes 11 and 12. Hence, the lightly doped diffusion layers 14 and 17 can be left in the element formation region 6 between the heavily doped impurity diffusion layer 22 and the lower portion of the gate electrode 12.

Figure 13D:
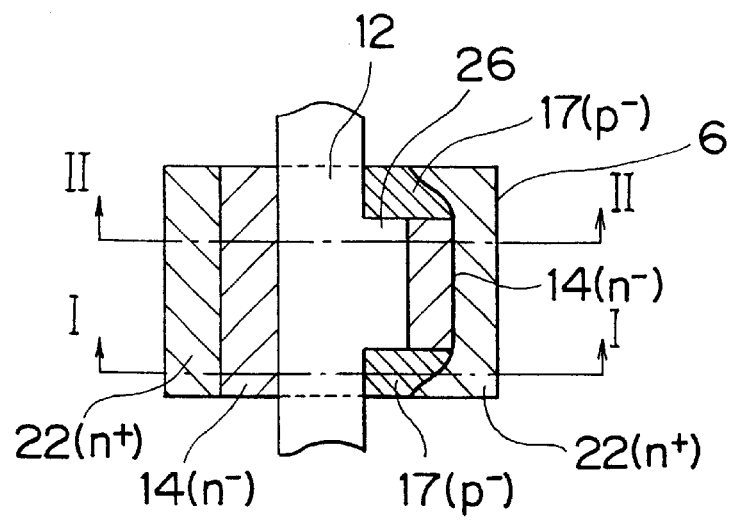

FIG. 13D shows the element formation region 6 at this time (the side walls 19 are not illustrated). FIG. 14B is an enlarged sectional view showing the portion near the element formation region 6 shown in FIG. 12E. On the element formation region 5 side of the band-shaped gate electrode 12, the heavily doped diffusion layer 22 is formed via the lightly doped diffusion layer 14 and connected to the lightly doped diffusion layer 14. On the element formation region 7 side of the gate electrode 12, the heavily doped diffusion layer 22 is connected to the lightly doped impurity diffusion layer 17 left under one of the side walls 19 formed on both sides of the projecting portion 26. Almost the central portion of the gate electrode 12 in the element formation region 6 in the longitudinal direction is connected at its two end portions to the lightly doped diffusion layers 14.

After the resist mask is removed by, e.g., ashing, a resist mask is formed on the p-type well 2 by photolithography so as to cover the element formation regions 5 and 6. $BF_2$ as a p-type impurity is ion-implanted into the element formation region 7 at a dose of 3 to $5 \times 10^{15}$ (1/cm$^2$) and acceleration energy of 65 to 70 (keV) using the resist mask as a mask, thereby forming heavily doped diffusion layers 23 ($p^+$ type) connected to the lightly doped diffusion layers 18 on the element formation region 7.

An nMOS transistor is constituted by the gate electrode 11 formed on the element formation region 5 and the lightly doped diffusion layers 13 and heavily doped diffusion layers 21 (serving as a source and drain) on both sides of the gate electrode 11, and a pMOS transistor is constituted by the gate electrode 16 formed on the element formation region 7 and the lightly doped diffusion layers 18 and heavily doped diffusion layers 23 (serving as a source and drain) on both sides of the gate electrode 16, thus constituting a CMOS transistor. In addition, a first input/output-side transistor is constituted by the gate electrode 12, the lightly doped diffusion layer 14 and heavily doped diffusion layer 22 (serving as a source), and the lightly doped diffusion layer 14, lightly doped diffusion layer 17, and heavily doped diffusion layer 22 (serving as a drain).

The order of ion implantation on the p-type well 2 side and ion implantation on the n-type well 3 side may be reversed.

Thereafter, an insulating interlayer or various interconnections are formed, thereby completing the semiconductor device of the third embodiment.

Figure 15A:
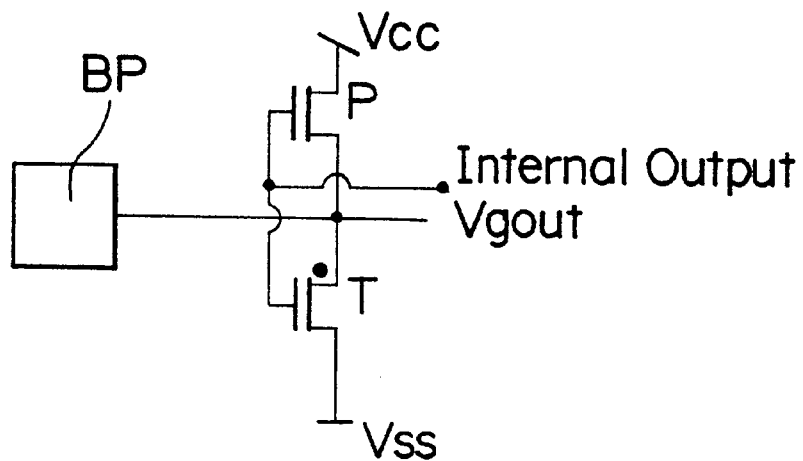
FIGS. 15A and 15B are equivalent circuit diagrams of the semiconductor device according to the third embodiment.
Figure 15B:
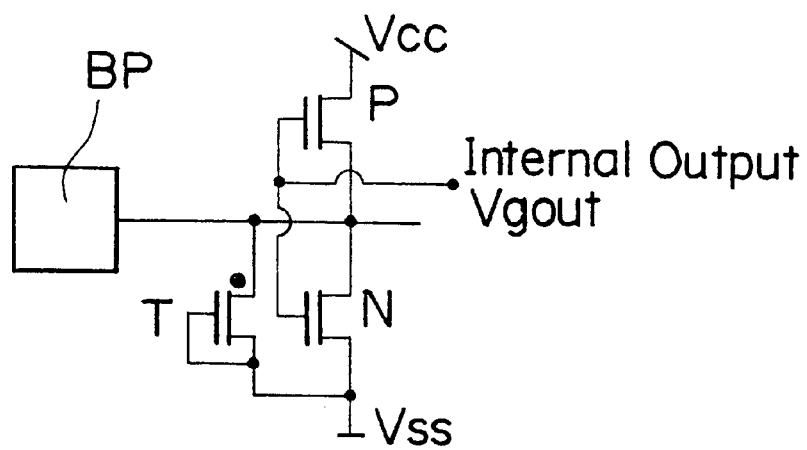

FIGS. 15A and 15B are equivalent circuit diagrams of the CMOS transistor and the first input/output-side transistor according to the third embodiment. As shown in FIG. 15A, the nMOS transistor of the CMOS transistor is represented by N; the pMOS transistor, P; and the first input/output-side transistor, T. As described above, the drain of the transistor T is constituted by a portion (portion a) at which the $n^+$-type heavily doped diffusion layer 22 is joined to the $p^-$-type lightly doped diffusion layer 17, and a portion (portion b) at which the $n^+$-type heavily doped diffusion layer 22 is joined to the $n^-$-type lightly doped diffusion layer 14, and directly connected to a bonding pad BP (indicated by ● in FIG. 15A). Therefore, at the portion a, the transistor T functions as an input protective circuit by holding an appropriate breakdown voltage, and at the portion b, it has operation characteristics equivalent to those of a normal transistor. In FIG. 15A, VGOUT represents the output from the internal circuit.

The three transistors formed by the above process can be connected as shown in FIG. 15B. The nMOS transistor of the CMOS transistor is represented by N; the pMOS transistor, P; and the first input/output-side transistor, T. A normal CMOS transistor is constituted by the nMOS transistor N and the pMOS transistor P, and the transistor T can functions as the input protective circuit by holding an appropriate breakdown voltage, as described above.

As described above, according to the third embodiment, an operation circuit having an input protection function and efficiently formed together with the CMOS transistor by the split gate method, and also having a high withstand strength and high-level functions is realized.

Fourth Embodiment

The fourth embodiment will be described next. In the fourth embodiment, a CMOS transistor and a first input/output-side transistor will be exemplified as a semiconductor device, and the structure thereof will be described together with the manufacturing method. More specifically, an input protective circuit is added to a CMOS transistor as an operation circuit also serving as an input protective circuit. FIGS. 16A to 16E and 17A to 17E are schematic sectional views showing the steps in manufacturing the semiconductor device according to the fourth embodiment. FIGS. 18A to 18D are schematic plan views showing the steps in manufacturing the semiconductor device according to the fourth embodiment. FIGS. 16A to 16E are schematic sectional views taken along an alternate long and short dashed line I—I in FIGS. 18A to 18D. FIGS. 17A to 17E are schematic sectional views taken along an alternate long and short dashed line II—II in FIGS. 18A to 18D. FIG. 19 is a sectional view showing part of the semiconductor device in FIG. 16E in detail. The same reference numerals as in the first embodiment denote the same members in the fourth embodiment.

Figure 16A:
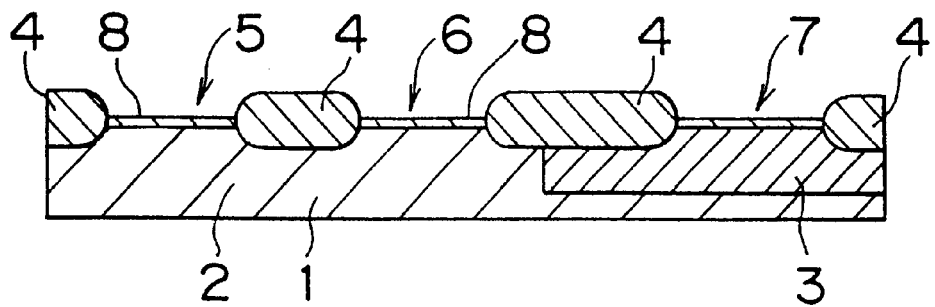
FIGS. 16A to 16E are schematic sectional views showing the steps in manufacturing a semiconductor device according to the fourth embodiment.
Figure 17A:
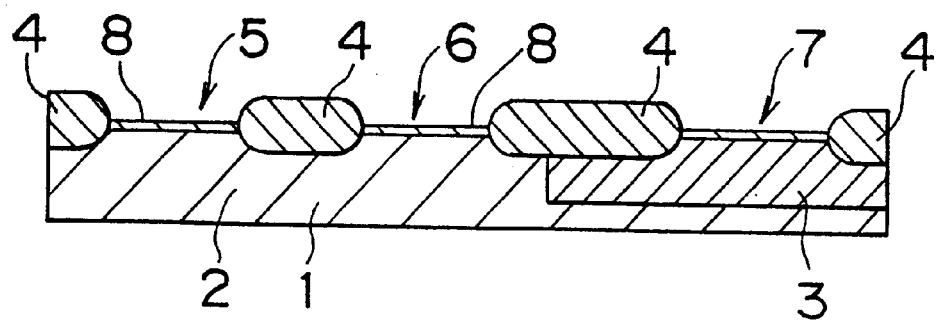
FIGS. 17A to 17E are schematic sectional views showing the steps in manufacturing the semiconductor device according to the fourth embodiment.

As shown in FIGS. 16A and 17A, an n-type well 3, a p-type well 2, and a field oxide film 4 are formed to define element formation regions 5 to 7 on a silicon semiconductor substrate 1, and a gate oxide film 8 is formed.

Figure 16B:
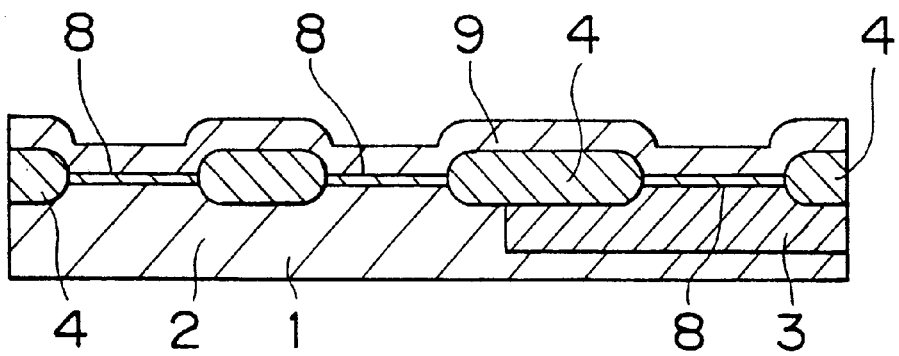
Figure 17B:
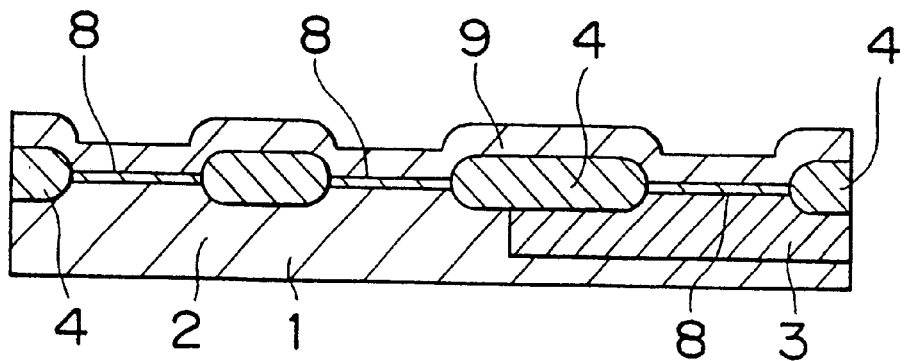

As shown in FIGS. 16B and 17B, a polysilicon film 9 doped with phosphorus (P) as an n-type impurity is deposited on the entire surface including the field oxide film 4 by CVD.

Figure 16C:
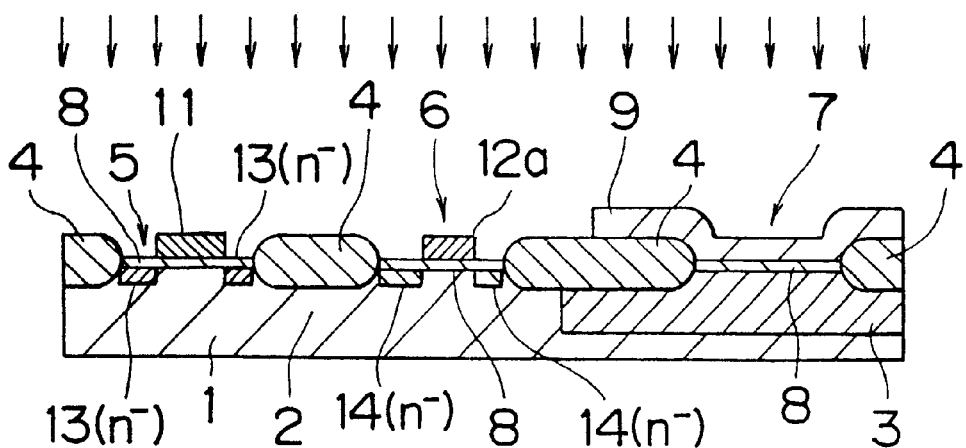
Figure 17C:
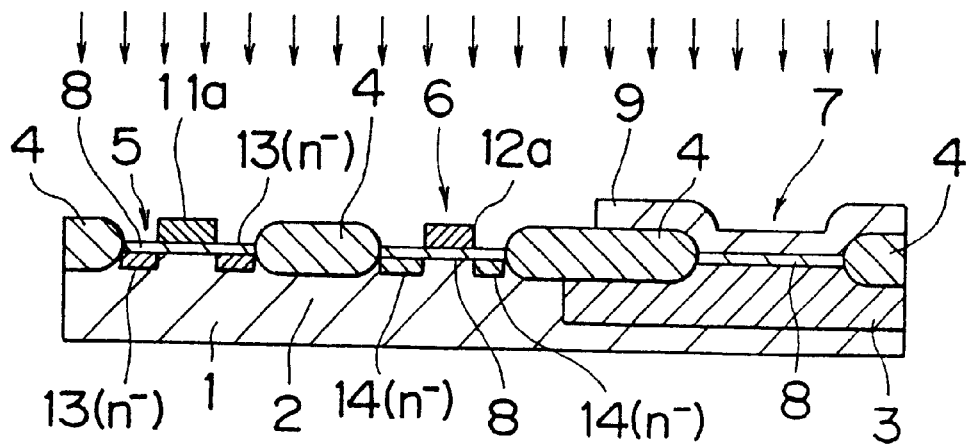

As shown in FIGS. 16C and 17C, the polysilicon film 9 is subjected to photolithography and dry etching to form a gate electrode pattern 11a having a predetermined shape on the element formation region 5 and a gate electrode pattern 12a having a predetermined shape on the element formation region 6.

FIGS. 18A to 18D are schematic plan views of the element formation region 5. FIG. 16C is a sectional view taken along an alternate long and short dashed line I—I in FIG. 18B. The gate electrode patterns 11a and 12a are formed such that their central portions on the element formation regions 5 and 6 are shifted to the element formation region 7 side. In addition, the polysilicon film 9 is left across the element formation region 7 and the field oxide film 4 near the element formation region 7.

Phosphorus (P) as an n-type impurity is ion-implanted into the entire surface at a dose of $3 \times 10^{13}$ (1/cm$^2$) and an acceleration energy of 20 to 30 (keV) using, as a mask, the gate electrode patterns 11a and 12a on the element formation regions 5 and 6 and the polysilicon film 9 left on the element formation region 7. With this process, a pair of lightly doped diffusion layers 13 ($n^-$ type) are formed in the surface region of the p-type well 2 on both sides of the gate electrode pattern 11a, and a pair of lightly doped diffusion layers 14 ($n^-$ type) are formed in the surface region of the p-type well 2 on both sides of the gate electrode pattern 12a. At this time, one of each pair of lightly doped diffusion layers 13 and 14 (serving as a drain) on the element formation region 7 side has a smaller width than that of the other.

Figure 16D:
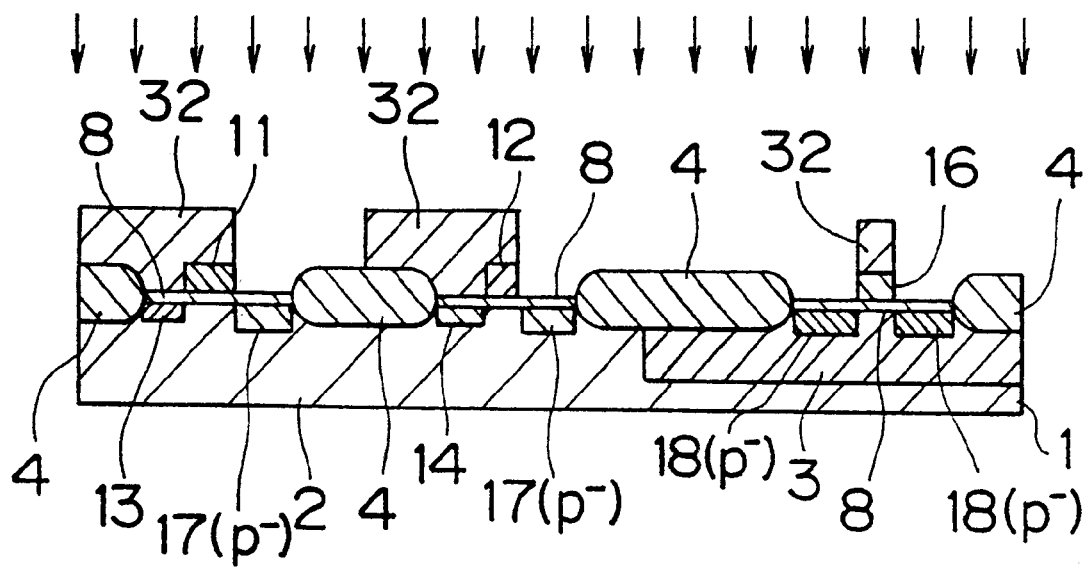
Figure 17D:
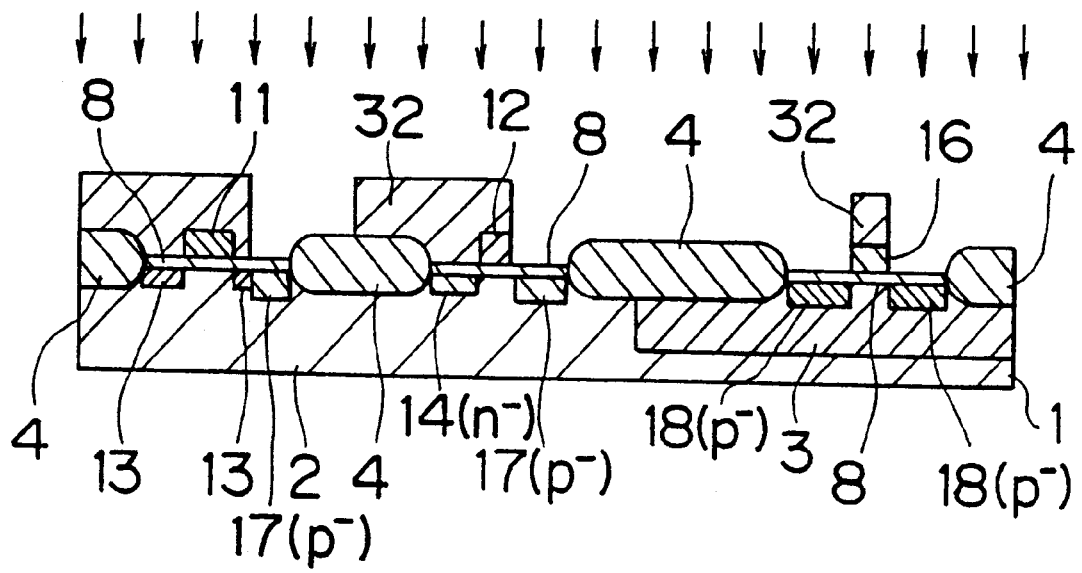
Figure 18A:
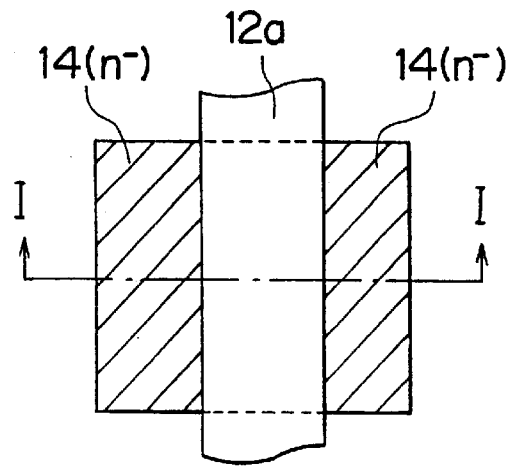
FIGS. 18A to 18D are schematic sectional views showing the steps in manufacturing the semiconductor device according to the fourth embodiment.
Figure 18B:
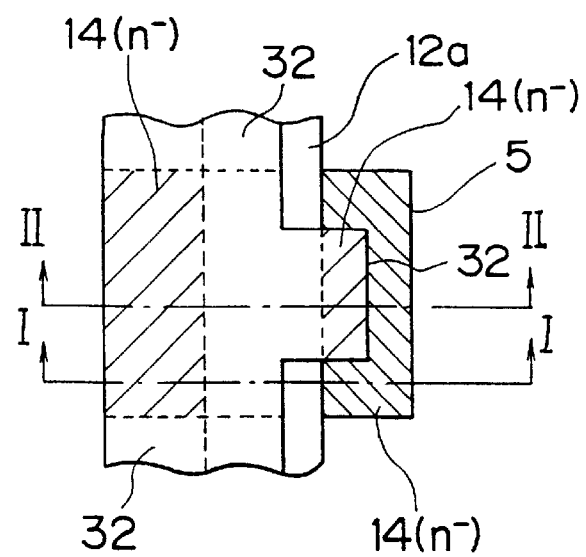

As shown in FIGS. 16D, 17D, and 18B, a photoresist is applied to the entire surface, and a resist mask 32 is formed by photolithography. As described above, FIGS. 18A to 18D are schematic plan views of the element active region 5. FIG. 16D is a sectional view taken along an alternate long and short dashed line I—I in FIG. 18B. FIG. 17D is a sectional view taken along an alternate long and short dashed line II—II in FIG. 18B. As shown in FIGS. 17D and 18B, the resist mask 32 in the element active region 5 is formed at the central position of the element active region 5 in the longitudinal direction of the gate electrode pattern 11a such that the entire surface and side surfaces of the gate electrode pattern 11a in the direction of gate width are covered. As shown in FIG. 18B, the resist mask 32 is formed at the end positions of the element active region 5 in the longitudinal direction of the gate electrode pattern 11a such that the gate electrode pattern 11a on the element active region 7 side is exposed. In the element active region 6, the resist mask 32 is formed to expose the element active region 7 side of the gate electrode pattern 12a, as in the first embodiment. The resist mask 32 is formed into a gate electrode shape even on the element formation region 7.

Dry etching is performed using the resist mask 32 as a mask to partially remove the gate electrode pattern 11a on the element formation region 5 to form a gate electrode 11 on the element formation region 5, as in the third embodiment. On the element active region 6, the gate electrode pattern 12a is partially removed to form a gate electrode 12 on the element formation region 6, as in the first embodiment. On the element formation region 7, a gate electrode 16 is formed. The gate electrode 11 has a shape conforming to the resist mask 32, so a projecting portion 27 is formed on the element active region 7 side in the direction of gate width.

$BF_2$ as a p-type impurity is ion-implanted into the entire surface at a dose of 4 to $5\times10^{13}$ (1/cm$^2$) and an acceleration energy of 50 to 70 (keV) using the resist mask 32 as a mask for ion implantation. At this time, the ions are partially repelled by the lightly doped diffusion layers 13 and 14 on the element formation region 7 side to form lightly doped diffusion layers 17 having an opposite conductivity type (i.e., p$^-$ type) in the element formation regions 5 and 6. At the same time, lightly doped diffusion layers 18 (p$^-$ type) are formed in the surface region of the n-type well 3 on both sides of the gate electrode 16 in the element formation region 7. As shown in FIG. 19, since the side surface of the gate electrode pattern 12a is covered with the resist mask 32 in the element active region 5, the conductivity (n$^{31}$) of the lightly doped diffusion layer 14 immediately under that portion is kept unchanged, as in the third embodiment.

Figure 16E:
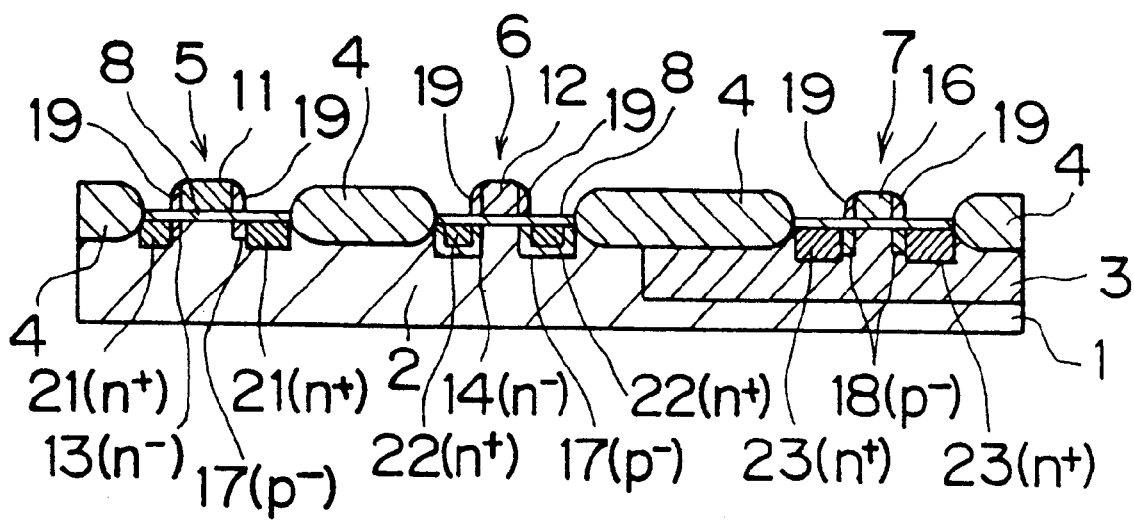
Figure 17E:
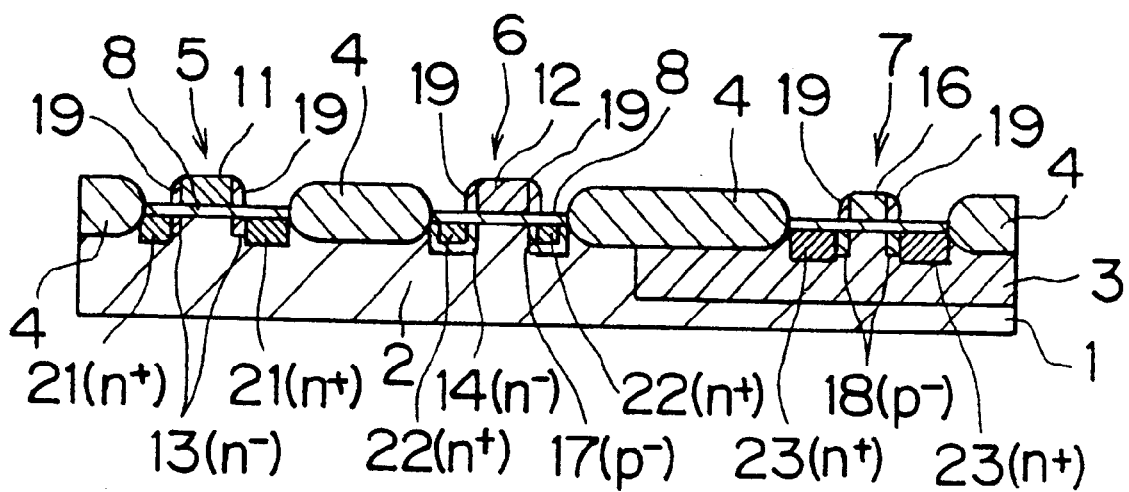

As shown in FIGS. 16E and 17E, after the resist mask 32 is removed by, e.g., ashing, a silicon oxide film is deposited on the entire surface. The entire surface of the silicon oxide film is subjected to anisotropic dry etching to leave the silicon oxide film only on the side surfaces of the gate electrodes 11, 12, and 16, thereby forming side walls 19.

A resist mask is formed on the p-type well 2 and the n-type well 3 by photolithography so as to cover the element active region 6 and the element formation region 7. Arsenic (As) as an n-type impurity is ion-implanted into the element formation region 6 at a dose of $5\times10^{15}$ to $1\times10^{16}$ (1/cm$^2$) and an acceleration energy of 60 to 70 (KeV) using the resist mask as a mask. With this process, heavily doped diffusion layers 22 (n$^+$ type) connected to the lightly doped diffusion layers 14 and 17, respectively, are formed in the element formation region 6.

More specifically, since the side walls 19 function as a mask for ion implantation, heavily doped impurity diffusion layers 21 in the element formation region 5 can be spaced apart from the gate electrode 11. Hence, the lightly doped diffusion layers 13 and 17 can be left in the element formation region 5 between the heavily doped impurity diffusion layer 21 and the lower portion of the gate electrode 11.

After this, a resist mask is formed on the p-type well 2 and the n-type well 3 by photolithography so as to cover the element active region 5 and the element formation region 7. Arsenic (As) as an n-type impurity is ion-implanted into the element formation region 5 at a dose of 1 to $3\times10^{15}$ (1/cm$^2$) and an acceleration energy of 50 to 60 (keV) using the resist mask as a mask.

Then ion implantation is performed under this condition, arsenic (As) can be prevented from reaching the bottom of the lightly doped diffusion layers 14 and 17 in the element formation region 6. For this reason, the heavily doped diffusion layers 22 in the element formation region 6 can be formed to be covered with the lightly doped diffusion layers 13 and 17 in the p-type well 2.

Figure 18C:
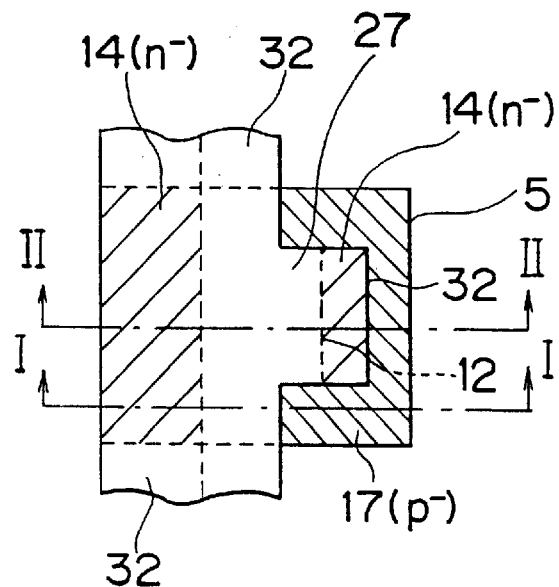
Figure 18D:
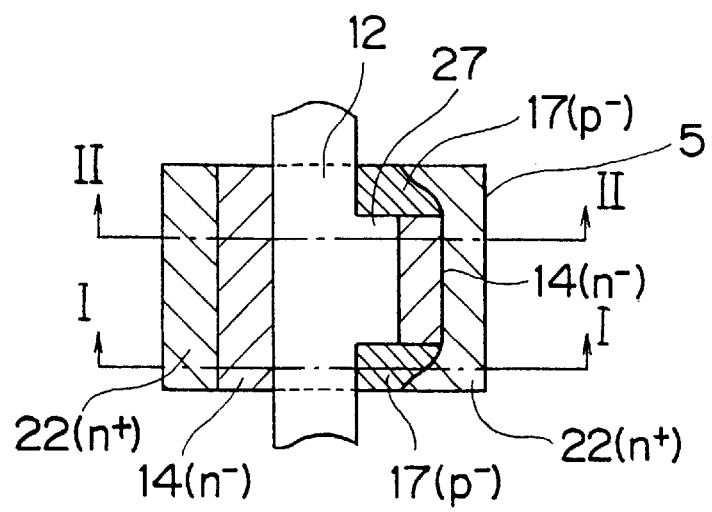
Figure 19:
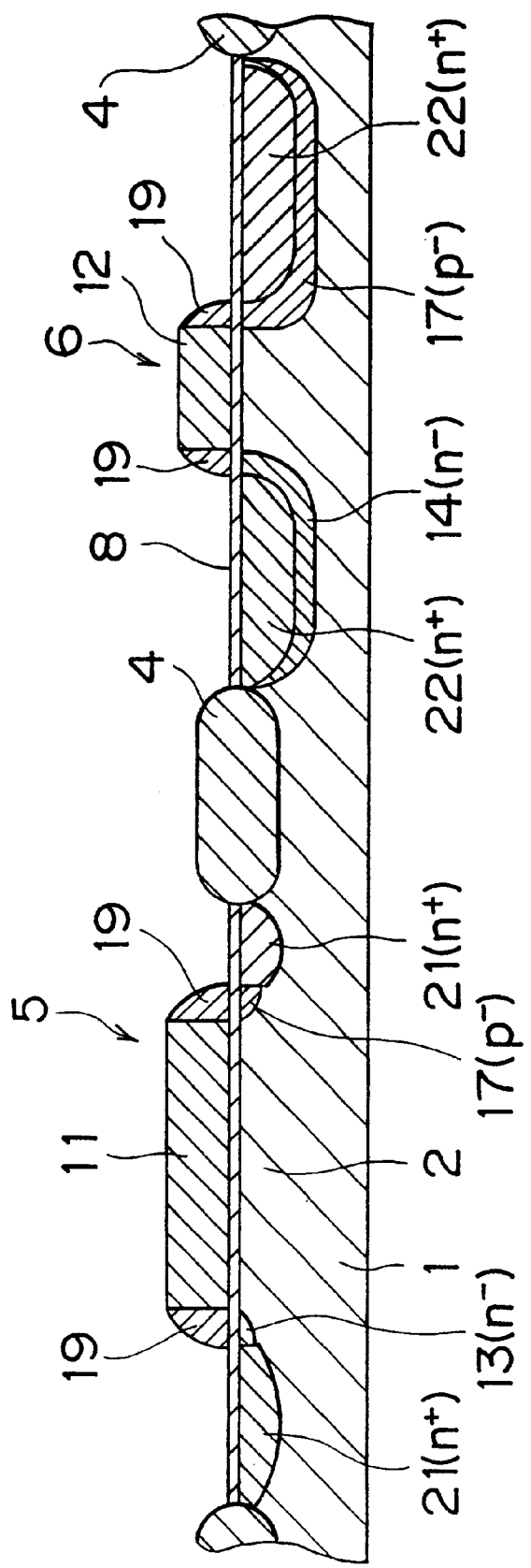
FIG. 19 is a schematic sectional view showing main process in manufacturing the semiconductor device according to the fourth embodiment.

FIG. 18C shows the element formation region 5 at this time (the side walls 19 are not illustrated). FIG. 19 is an enlarged sectional view showing the portion near the element formation regions 5 and 6 shown in FIG. 16E. On the element formation region 5 on the opposite side of the element formation region 6 of the band-shaped gate electrode 11, the heavily doped diffusion layer 22 is formed via the lightly doped diffusion layer 14 and connected to the lightly doped diffusion layer 14, as in the third embodiment. On the element formation region 6 side of the gate electrode 11, the heavily doped diffusion layer 22 is connected to the lightly doped impurity diffusion layer 17 left under the side wall. At almost the central portion of the element active region 5 in the longitudinal direction of the gate, the heavily doped diffusion layers 22 at two ends are connected to the lightly doped diffusion layers 14.

As shown in FIG. 19, in the fourth embodiment, since the heavily doped diffusion layers 22 can be formed to be covered with the lightly doped diffusion layers 14 and 17 in the element active region 6 in the p-type well 2, the lightly doped diffusion layer 17 formed in the element active region 5 can also have the input protection function.

After the resist mask is removed by, e.g., ashing, a resist mask is formed on the p-type well 2 by photolithography so as to cover the element formation regions 5 and 6. $BF_2$ as a p-type impurity is ion-implanted into the element formation region 7 at a dose of 3 to $5\times10^{15}$ (1/cm$^2$) and acceleration energy of 65 to 70 (keV) using the resist mask as a mask, thereby forming heavily doped diffusion layers 23 (p$^+$ type) connected to the lightly doped diffusion layers 18 on the element formation region 7.

With this process, an nMOS transistor having only the input protection function is constituted by the gate electrode 12 formed on the element formation region 6 and the lightly doped diffusion layer 14 and heavily doped diffusion layer 22 (serving as a source and drain) on both sides of the gate electrode 12. A pMOS transistor is constituted by the gate electrode 11 formed on the element formation region 5 and the lightly doped diffusion layers 13 and 17 and heavily doped diffusion layers 21 (serving as a source and drain) on both sides of the gate electrode 11, thus constituting a CMOS transistor. At the portion of the lightly doped diffusion layer 17, the nMOS transistor on the element active region 5 can have a function as an input protective circuit by holding an appropriate breakdown voltage, and in the region of the lightly doped impurity diffusion layers 14, it can function as a normal transistor.

The order of ion implantation on the p-type well 2 side and ion implantation on the n-type well 3 side may be reversed.

Thereafter, an insulating interlayer or various interconnections are formed, thereby completing the semiconductor device of the fourth embodiment.

Figure 7:
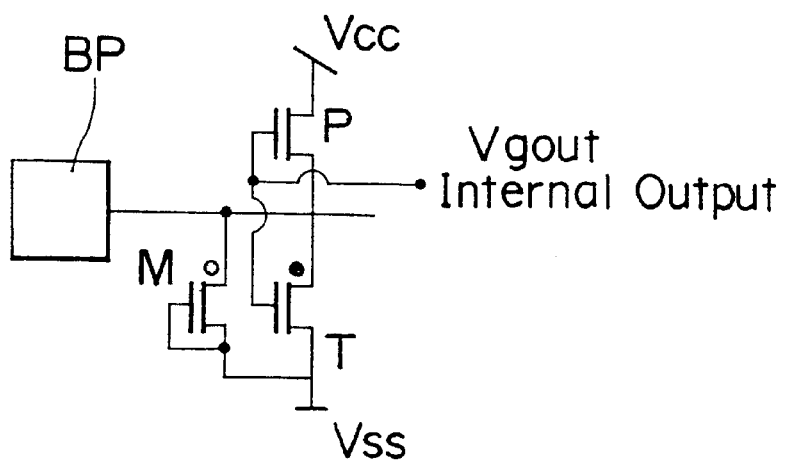
FIG. 7 is an equivalent circuit diagram of a semiconductor device according to the fourth embodiment.

FIG. 7 is an equivalent circuit diagram of the CMOS transistor and the first input/output-side transistor according to the fourth embodiment. A schematic view showing the connection state and section is the same as FIG. 6. The nMOS transistor of the CMOS transistor is represented by T; the pMOS transistor, P; and the transistor having a protection function, M.

As described above, the drain of the transistor T is constituted by a portion (portion a) at which the n$^+$type heavily doped diffusion layer 22 is joined to the p$^-$-type lightly doped diffusion layer 17, and a portion (portion b) at which the n$^+$-type heavily doped diffusion layer 22 is joined to the n$^-$-type lightly doped diffusion layer 14, and directly connected to a bonding pad BP (indicated by ● in FIG. 7). Therefore, at the portion a, the transistor T functions as an input protective circuit by holding an appropriate breakdown voltage, and at the portion b, it has operation characteristics equivalent to those of a normal transistor. In FIG. 7, V$_{GOUT}$ represents the output from the internal circuit.

In the fourth embodiment, the transistor having the p-type lightly doped diffusion layer is arranged parallel to the first input/output-side transistor (in FIG. 7). With this arrangement, both the transistors M and T can have the function as the input protective circuit, so the protection function is enhanced, and the reliability of the semiconductor device can be further increased.

As described above, according to the fourth embodiment, an operation circuit having an input protection function and efficiently formed together with the CMOS transistor by the split gate method, and also having a high withstand strength and high-level functions is realized.

What is claimed is:

1. A semiconductor device, comprising:
   an electrostatic discharge protection means for protecting a second transistor from an electrostatic discharge, said protection means having a first transistor formed on a semiconductor substrate, said first transistor having:
   a first gate formed on said semiconductor substrate via a first insulating film;
   a first conductive region formed in a surface region of said semiconductor substrate on one side of said first gate;
   a second conductive region formed in the surface region of said semiconductor substrate on the other side of said first gate;
   a third conductive region formed in the surface region of said semiconductor substrate between said first conductive region and a lower portion on one side of said first gate of said first transistor; and
   a fourth conductive region formed in the surface region of said semiconductor substrate between said second conductive region and a lower portion on the other side of said first gate of said first transistor, wherein
   said first, second, and third conductive regions have the same conductivity type while said fourth conductive region has a conductivity type opposite to that of said third conductive region,
   said third conductive region has a resistance higher than that of said first conductive region,
   said second transistor has a second gate formed on said semiconductor substrate via a second insulating film and a pair of conductive regions, and
   one of said pair of conductive regions being connected to at least one of said first and second conductive regions.

2. A device according to claim 1, wherein said first gate has a projecting portion on said second conductive region side.

3. A device according to claim 2, wherein said fourth conductive region is formed on the surface region of said semiconductor substrate on both sides of said projecting portion.

4. A device according to claim 2, wherein a conductive region having the same conductivity type as that of said second conductive region and a resistance higher than that of said second conductive region is formed in the surface region of said semiconductor substrate at a lower portion of a distal end portion of said projecting portion.

5. A device according to claim 1, wherein said first insulating film is thicker than said second insulating film.

6. A device according to claim 1, further comprising a third transistor having a gate formed on said semiconductor substrate via a third insulating film and a pair of conductive regions, and
   wherein one of said first and second transistors, and said third transistor constitute a CMOS transistor.

7. A device according to claim 1, wherein said second and fourth conductive regions contain an impurity, and an impurity concentration ratio between said second conductive region and said fourth conductive region is on an order of 100.

8. A device according to claim 1, wherein said fourth conductive region is formed to cover a region from a side surface to a lower surface of said second conductive region.

9. A device according to claim 1, wherein an impurity concentration in said third conductive region is lower than that in said first conductive region.

10. A device according to claim 1, wherein an impurity concentration in said fourth conductive region is lower than that in said second conductive region.

11. A device according to claim 1, wherein said second conductive region functions as a drain of said transistor.

12. A device according to claim 1, wherein an impurity concentration ratio between said third conductive region and said first conductive region is on an order of 100.

13. A device according to claim 1, wherein said third conductive region being formed to cover a region from a side surface to a lower surface of said first conductive region.

14. A semiconductor devices, comprising:
   an electrostatic discharge protection means for protecting a juxtaposed semiconductor element from an electrostatic discharge, said protection means formed on said semiconductor substrate and having:
   a first semiconductor region;
   a first conductive film patterned on said first semiconductor region via a first insulating film; and
   a pair of first diffusion layers formed by doping an impurity in a surface region of said first semiconductor region on both sides of said first conductive film, wherein
   one of said first diffusion layers being formed at least near said first conductive film and having at least a first lightly doped portion having the same conductivity type as that of said first semiconductor region and a first heavily doped portion having a conductivity type opposite to that of said first semiconductor region and connected to said first lightly doped portion, and
   the other of said first diffusion layers being formed at least near said first conductive film and having a second lightly doped portion having a conductivity type opposite to that of said first semiconductor region and a second heavily doped portion having a conductivity type opposite to that of said first semiconductor region and connected to said second lightly doped portion.

15. A device according to claim 14, wherein a concentration ratio between said first heavily doped portion and said first lightly doped portion is on an order of 100.

16. A device according to claim 14, wherein said first insulating film is made thick immediately under said first conductive film.

17. A device according to claim 14, wherein said first conductive film is partially formed wide on a side of one of said first diffusion layers, and a third lightly doped portion having a conductivity type opposite to that of said first heavily doped portion is formed adjacent to said wide portion.

18. A device according to claim 14, wherein said first conductive film is formed into a gate electrode shape and has a projecting portion on said second conductive film side in a direction of gate width, and said first lightly doped portion is formed in the surface region of said semiconductor substrate at an edge portion of said projecting portion.

19. A device according to claim 18, further comprising a side wall covering a side surface portion of said first conductive film, and wherein a lower portion of said first lightly doped portion is covered with said side wall.

20. A device according to claim 14, wherein said first lightly doped portion is formed to cover a region from a side surface to a lower surface of said first heavily doped portion.

21. A semiconductor device, comprising:

an electrostatic discharge protection means for protecting a juxtaposed second transistor from an electrostatic discharge, said protection means formed on said semiconductor substrate and having a first transistor, said first transistor having:

a gate formed on a semiconductor substrate via an insulating film;

a first conductive region formed in a surface region of said semiconductor substrate on one side of said gate;

a second conductive region formed in the surface region of said semiconductor substrate on the other side of said gate, said gate having a projecting portion on said second conductive region side in a direction of gate width;

a third consecutive region formed at least in the surface region of said semiconductor substrate between said first conductive region and a lower portion on one side of said gate of said first transistor, said third conductive region having a resistance higher than that of said first conductive region;

a fourth conductive region formed in the surface region of said semiconductor substrate at a lower portion of a distal end region of said projecting portion of said gate, said fourth conductive region having a resistance higher than that of said second conductive region, and said first, second, third, and fourth conductive regions having the same conductivity type; and a fifth conductive region formed in the surface region of said semiconductor substrate at an edge portion of said projecting portion of said gate, said fifth conductive region having a conductivity type opposite to that of said third conductive region, wherein said first, second, third, and fourth conductive regions have the same conductivity type.

22. A device according to claim 21, further comprising a side wall covering a side surface of said gate of said first transistor, and wherein said third and fifth conductive regions are formed at a lower portion of said side wall.

23. A device according to claim 21, wherein said second conductive region functions as a drain of said first transistor.

* * * * *